(12) United States Patent
Matsumoto et al.

(10) Patent No.: US 11,967,976 B2
(45) Date of Patent: Apr. 23, 2024

(54) CODING DEVICE, CODING METHOD, DECODING DEVICE, DECODING METHOD, AND PROGRAM

(71) Applicant: Sony Corporation, Tokyo (JP)

(72) Inventors: Jun Matsumoto, Kanagawa (JP); Shiro Suzuki, Kanagawa (JP); Shuichiro Nishigori, Tokyo (JP); Hirofumi Takeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 510 days.

(21) Appl. No.: 17/269,950

(22) PCT Filed: Jul. 22, 2019

(86) PCT No.: PCT/JP2019/028619
§ 371 (c)(1),
(2) Date: Feb. 19, 2021

(87) PCT Pub. No.: WO2020/044857
PCT Pub. Date: Mar. 5, 2020

(65) Prior Publication Data
US 2022/0158655 A1    May 19, 2022

(30) Foreign Application Priority Data
Aug. 28, 2018    (JP) .................. 2018-159210

(51) Int. Cl.
*H03M 7/30*    (2006.01)
*G06F 3/01*    (2006.01)
*H03M 7/40*    (2006.01)

(52) U.S. Cl.
CPC ............. *H03M 7/70* (2013.01); *G06F 3/016* (2013.01); *H03M 7/3073* (2013.01); *H03M 7/4031* (2013.01)

(58) Field of Classification Search
CPC ..... H03M 7/70; H03M 7/3073; H03M 7/4031
(Continued)

(56) References Cited

U.S. PATENT DOCUMENTS

| | | | |
|---|---|---|---|
| 2009/0279804 A1* | 11/2009 | Ahmed ................ | H04N 1/4406 |
| | | | 382/248 |
| 2017/0354870 A1 | 12/2017 | Okamura | |
| 2019/0052883 A1* | 2/2019 | Ikeda .................. | H03M 7/6005 |

FOREIGN PATENT DOCUMENTS

| | | |
|---|---|---|
| EP | 3254739 A1 | 12/2017 |
| JP | 2006-279272 A | 10/2006 |
| JP | 2017-221631 A | 12/2017 |

OTHER PUBLICATIONS

International Search Report and English translation thereof dated Sep. 3, 2019 in connection with International Application No. PCT/JP2019/028619.
(Continued)

*Primary Examiner* — Peguy Jean Pierre
(74) *Attorney, Agent, or Firm* — Wolf, Greenfield & Sacks, P.C.

(57) ABSTRACT

To reduce data amount while ensuring tactile reproducibility of a two-dimensional tactile signal, and improve the efficiency of a system related to tactile reproduction.

Coding is performed to compress information amount by orthogonally transforming a two-dimensional tactile signal based on a time signal. By orthogonally transforming a two-dimensional tactile signal based on a time signal, it is possible to compress information amount by removing frequency components that are difficult for humans to perceive, as in the case of an image signal, for example. Accordingly, it is possible to reduce data amount while ensuring tactile (Continued)

reproducibility of a two-dimensional tactile signal, and improve the efficiency of a system related to tactile reproduction.

19 Claims, 20 Drawing Sheets

(58) Field of Classification Search
    USPC .................................... 341/87, 63, 65, 50
    See application file for complete search history.

(56) References Cited

OTHER PUBLICATIONS

Tanaka et al., Haptic data compression/decompression using DCT for motion copy system. 2009 IEEE International Conference on Mechatronics. Apr. 2009. 6 pages. URL:https://ieeexplore.ieee.org/stamp/stamp.jsp?tsp=&arnumber=4957156.

* cited by examiner

FIG. 9
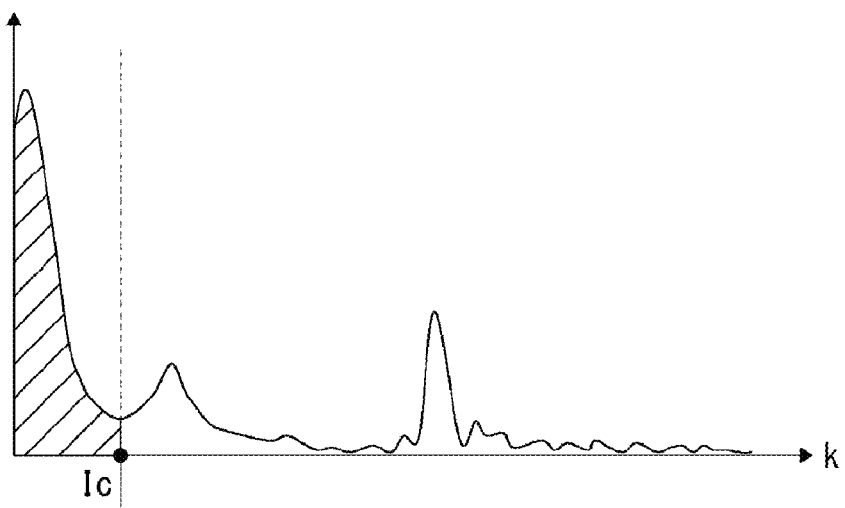
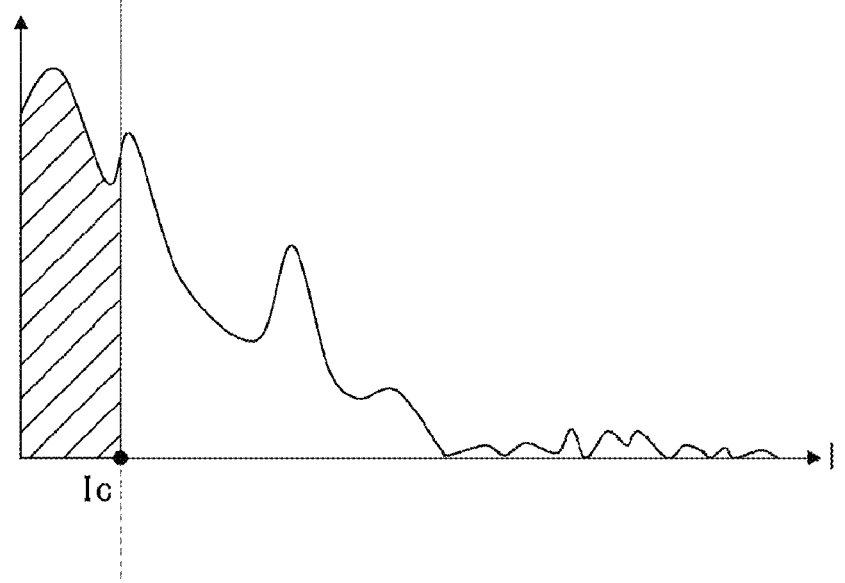

*FIG. 12*
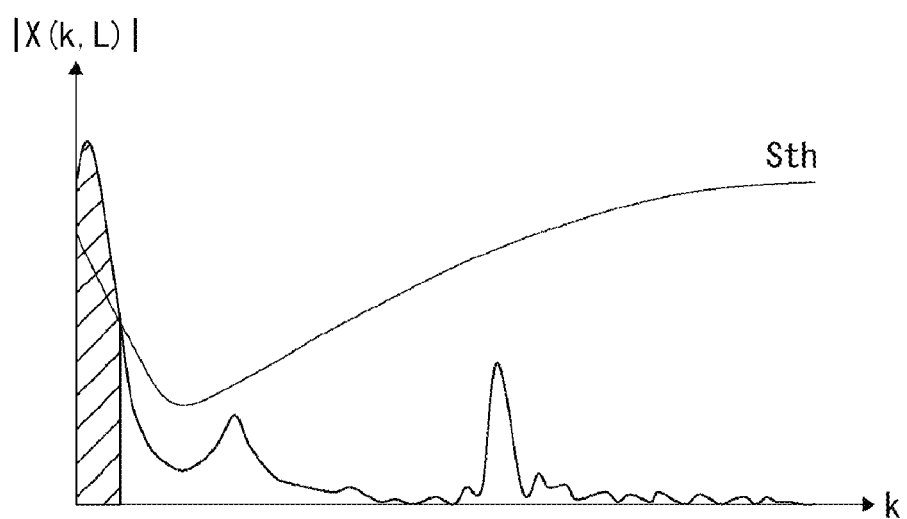
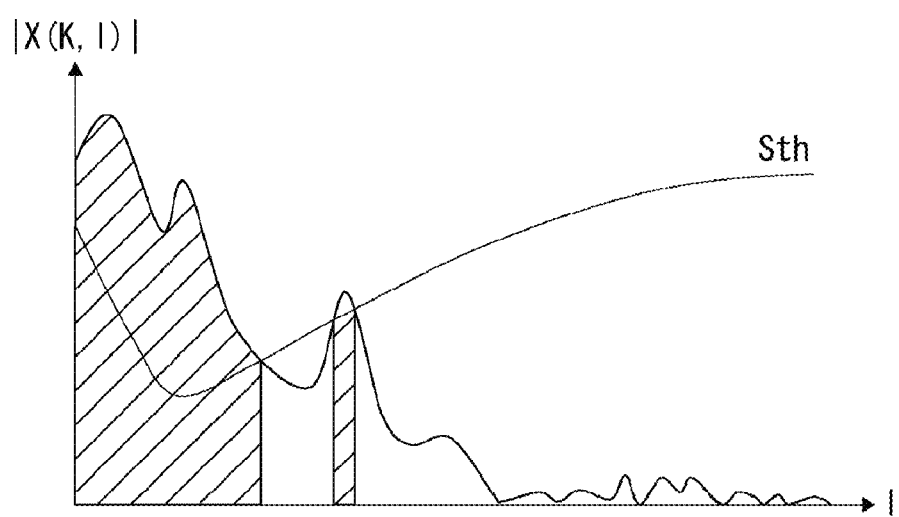

FIG. 15
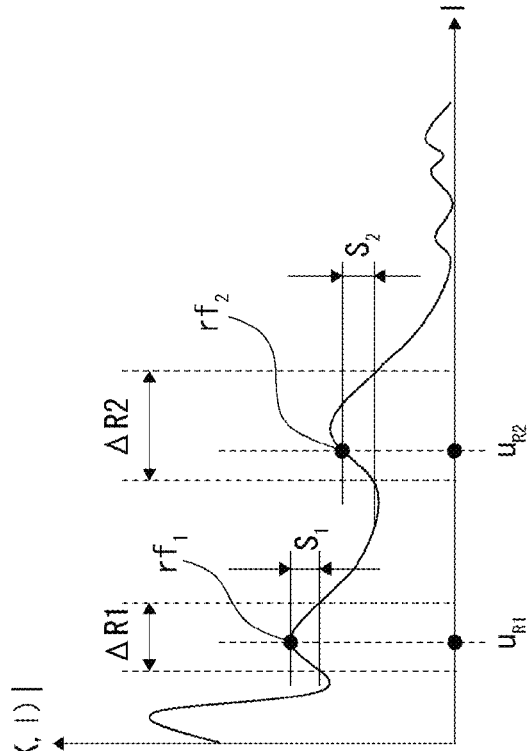
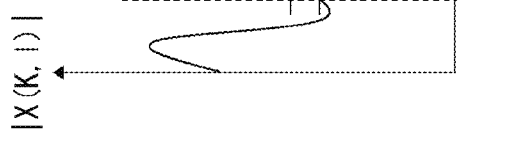
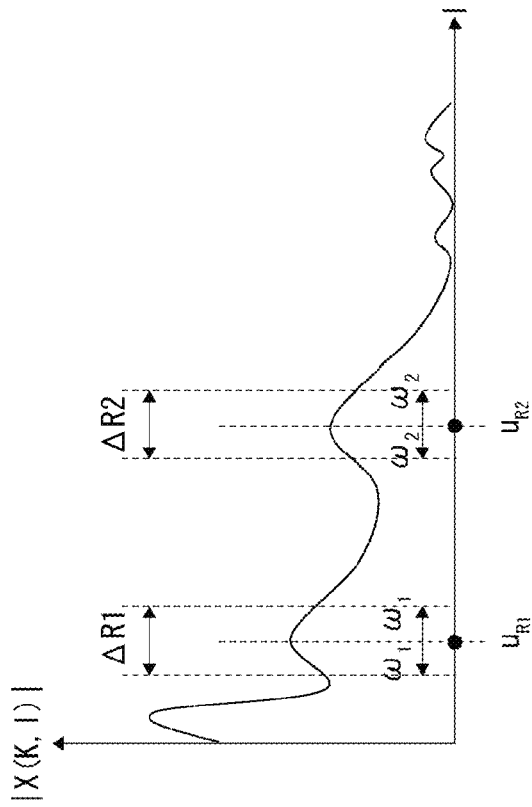

FIG. 16
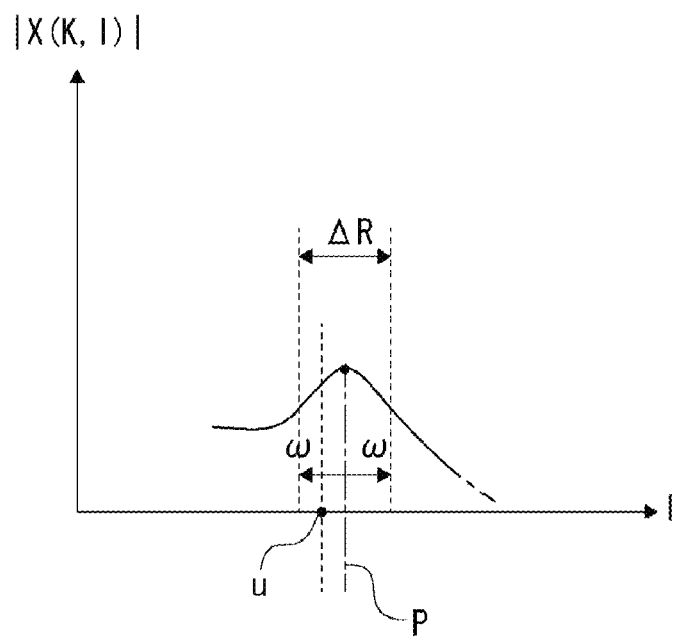
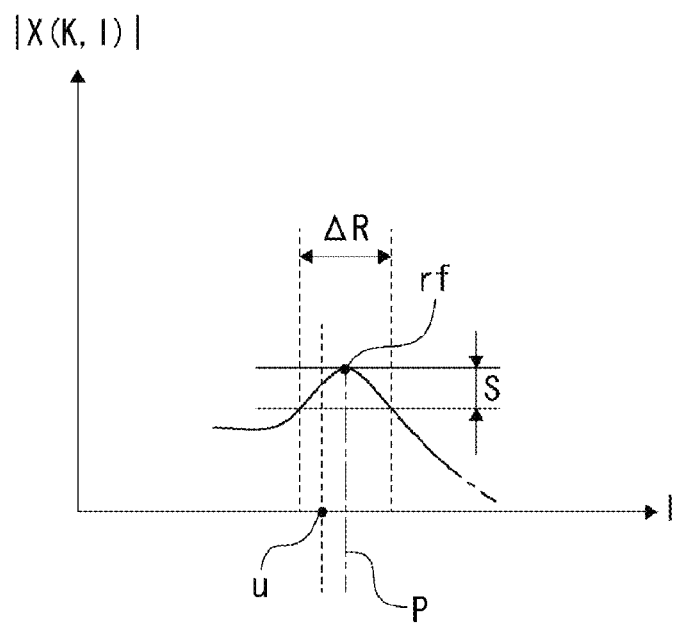

FIG. 19
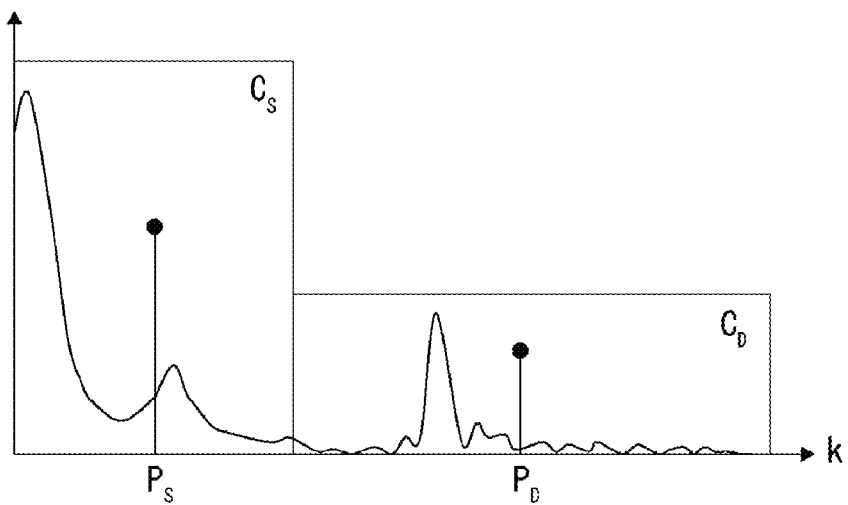
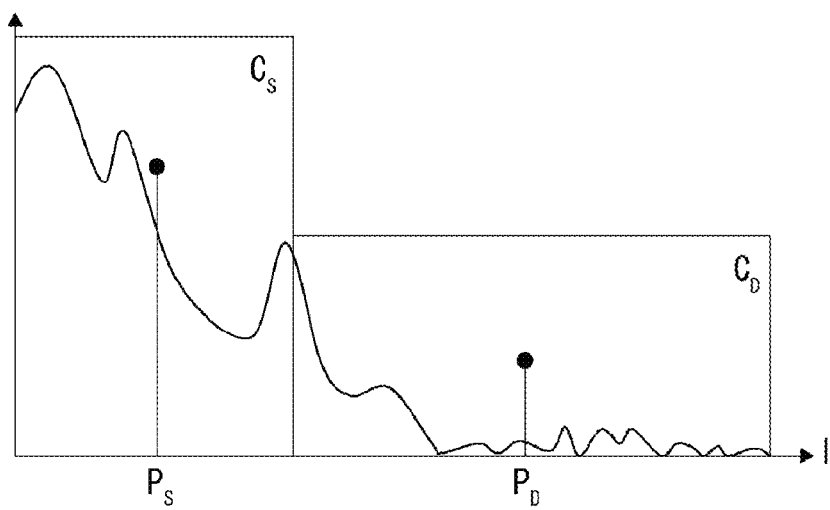

FIG. 21
A 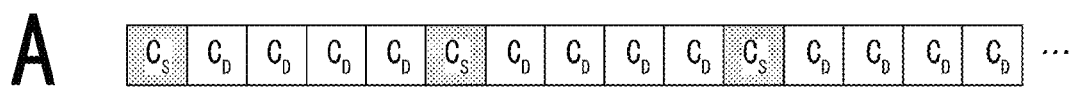
B 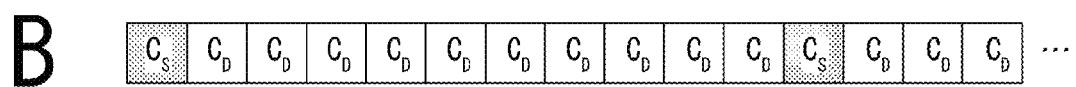

CODING DEVICE, CODING METHOD, DECODING DEVICE, DECODING METHOD, AND PROGRAM

CROSS-REFERENCE TO RELATED APPLICATIONS

This application claims the benefit under 35 U.S.C. § 371 as a U.S. National Stage Entry of International Application No. PCT/JP 2019/028619, filed in the Japanese Patent Office as a Receiving Office on Jul. 22, 2019, which claims priority to Japanese Patent Application Number JP 2018-159210, filed in the Japanese Patent Office on Aug. 28, 2018, each of which is hereby incorporated by reference in its entirety.

TECHNICAL FIELD

The present technology relates to a coding device and its method for coding a two-dimensional tactile signal, a decoding device and its method for decoding coded data of the two-dimensional tactile signal, and a program.

BACKGROUND ART

In recent years, applications that give tactile stimuli by a tactile presentation device in contact with the human skin have been used in various situations. Here, "tactile presentation" means to generate a tactile stimulus.

For example, in a mobile terminal equipped with a touch panel such as a smartphone, the touch feeling of a button is simulated by vibrating a panel (or housing) when the panel is touched to give a tactile stimulus to the finger.

In music listening, a tactile presentation device is built into a headphone housing, and tactile stimuli are given in parallel with music playback to emphasize deep bass.

In the fields of computer games and virtual reality (VR), the user's immersive feeling can be enhanced by interactively giving tactile stimuli matching the scene by a tactile presentation device installed in a controller, according to the user's operation.

In some amusement facilities, the realistic feeling of visitors is improved by giving tactile stimuli by a tactile presentation device installed in a seat according to the situation in a movie theater, a theme park, or the like.

Additionally, in the research and development stage, when a robot or the like is remotely controlled, vibration received by the robot or an object to be operated is fed back to a controller at the operator's hand, so that the robot or the like can intuitively perceive the situation around the robot or the object and use the information for hazard anticipation (e.g., disaster response robot <http://www.rm.is.tohoku.ac.jp/quince_mech/#_8>)

Moreover, in the medical field, research is being conducted to improve surgical accuracy by feeding back, to the operator, the feel (hardness) when forceps of an endoscope touches an organ while operating a surgical robot (e.g., surgical support robot Da Vinci <http://techon.nikkeibp.co.jp/article/FEATURE/20150217/404460/?P=2>)

On the other hand, as for tactile presentation devices, eccentric motors (ERM), linear actuators (LRA), and the like are often used, and most of them are considered to be devices having resonance frequencies of frequencies with high human tactile sensitivity (about several hundred Hz) (see Patent Document 1 below, for example).

Additionally, for example, there is an effort to further enhance the realistic feeling by preparing multiple tactile presentation devices and attaching them to the entire body to give tactile stimuli. (e.g., Synesthesia suit <http://rezinfinite.com/ja/synesthesia-suit/>)

CITATION LIST

Patent Document

Patent Document 1: Japanese Patent Application Laid-Open No. 2016-202486

SUMMARY OF THE INVENTION

Problems to be Solved by the Invention

Here, as a tactile presentation device, a device in which multiple tactile presentation elements such as a vibrating pin and a micropump are arranged in a two-dimensional plane has been developed (hereinafter referred to as "two-dimensional tactile presentation device"). By using such a two-dimensional tactile presentation device, it is possible to present extremely diverse and complex tactile stimuli.

As a two-dimensional tactile presentation device, it is effective to increase the number of tactile presentation elements arranged to enable presentation of a more diverse tactile stimuli. However, increasing the number of tactile presentation elements increases the number of tactile signal channels, which leads to an increase in the data amount. If the amount of tactile signal data increases, the processing load related to tactile reproduction may increase and transmission delay may occur, for example, which is not desirable.

The present technology has been made in view of the above circumstances, and aims to improve the efficiency of a system related to tactile reproduction by reducing data amount while ensuring tactile reproducibility of a two-dimensional tactile signal.

Solutions to Problems

A coding device according to the present technology includes a coding unit that performs coding of compressing information amount by orthogonally transforming a two-dimensional tactile signal based on a time signal.

By orthogonally transforming a two-dimensional tactile signal based on a time signal, it is possible to compress information amount by removing frequency components that are difficult for humans to perceive, as in the case of an image signal, for example.

Additionally, the coding method according to the present technology is a coding method of performing coding of compressing information amount by orthogonally transforming a two-dimensional tactile signal based on a time signal.

With such a coding method, too, an effect similar to that of the above coding device according to the present technology can be obtained.

Moreover, the coding-side program according to the present technology is a program that causes an information processing apparatus to achieve a function of performing coding of compressing information amount by orthogonally transforming a two-dimensional tactile signal based on a time signal.

The coding device according to the present technology described above is implemented by such a program.

Additionally, the decoding device according to the present technology includes a decoding unit that decodes coded data obtained by performing coding of compressing information amount by orthogonally transforming a two-dimensional tactile signal based on a time signal.

By orthogonally transforming a two-dimensional tactile signal based on a time signal, it is possible to compress information amount by removing frequency components that are difficult for humans to perceive, as in the case of an image signal, for example.

In the decoding device according to the present technology described above, it is desirable that the decoding unit decode the coded data in which information amount is compressed by extracting a low-frequency component.

With orthogonal conversion such as discrete cosine transform (DCT), the energy of a time signal is efficiently concentrated on the low-frequency side of a spectrum. Hence, even if the low-frequency component is extracted and the other components are removed, it is unlikely that the recipient will sense unnaturalness.

In the decoding device according to the present technology described above, it is desirable that the decoding unit decode the coded data in which information amount is compressed on the basis of the human tactile characteristic.

This makes it possible to compress information amount by removing frequency components having low human tactile sensitivity.

In the decoding device according to the present technology described above, it is desirable that the decoding unit decode the coded data in which information amount is compressed by extracting a frequency component whose absolute value of an orthogonal transform coefficient is equal to or greater than a threshold.

This makes it possible to extract frequency components that are presumed to be easily perceived by humans in terms of the magnitude of the orthogonal transform coefficient (spectrum) and remove other components.

In the decoding device according to the present technology described above, it is desirable that the threshold is a threshold determined on the basis of the human tactile characteristic.

As a result, it is possible to remove frequency components having low human tactile sensitivity even if the orthogonal transform coefficient is large.

In the decoding device according to the present technology described above, it is desirable that the decoding unit decode the coded data in which information amount is compressed on the basis of the tactile characteristic of each receptor.

This makes it possible to extract highly sensitive frequency components for each receptor and remove other components.

In the decoding device according to the present technology described above, it is desirable that the decoding unit decode the coded data in which information amount is compressed by extracting a representative value of an orthogonal transform coefficient in the vicinity of a peak frequency of a sensitivity of the receptor.

The above representative value means a typical value of the orthogonal transform coefficient in the vicinity of the peak frequency, such as a weighted average value, a median value, and a maximum value of the orthogonal transform coefficient in the vicinity of the peak frequency. By extracting such a representative value, it is possible to appropriately extract a frequency component having high sensitivity of the receptor.

In the decoding device according to the present technology described above, it is desirable that the decoding unit decode the coded data in which a frequency index corresponding to the peak frequency of the sensitivity of the receptor is assigned as a frequency index of the representative value.

This makes it possible to efficiently present tactile sensation according to the peak frequency of the sensitivity of the receptor.

In the decoding device according to the present technology described above, it is desirable that the decoding unit decode the coded data in which information amount is compressed on the basis of a device characteristic, which is a frequency characteristic of a tactile presentation device.

As a result, it is possible for the tactile presentation device to extract frequency components capable of efficiently presenting tactile sensation, and to remove other components.

In the decoding device according to the present technology described above, it is desirable that the decoding unit decode the coded data in which information amount is compressed on the basis of the device characteristic of multiple tactile presentation devices.

As a result, in a case of presenting tactile sensation using a different tactile presentation device for each receptor, or using a different tactile presentation device for each of a static tactile sensation and a dynamic tactile sensation, it is possible for each tactile presentation device to extract frequency components that can present tactile sensation efficiently and remove other components.

In the decoding device according to the present technology described above, it is desirable that the decoding unit decode the coded data in which information amount is compressed by extracting a representative value of an orthogonal transform coefficient in the vicinity of a peak frequency of the device characteristic.

This makes it possible for the tactile presentation device to appropriately extract frequency components capable of efficiently presenting tactile sensation.

In the decoding device according to the present technology described above, it is desirable that the decoding unit decode the coded data in which a frequency index corresponding to the peak frequency of the device characteristic is assigned as a frequency index of the representative value.

This makes it possible to efficiently present tactile sensation according to the peak frequency of the device characteristics.

It its desirable that the decoding device according to the present technology described above further include an information transmission unit that transmits information for identifying the device characteristic to an external device.

As a result, it is possible to notify the coding device of information for identifying the device characteristics of the tactile presentation device.

In the decoding device according to the present technology described above, it is desirable that the decoding unit decode the coded data in which information amount is compressed by extracting a representative value of an orthogonal transform coefficient from a frequency band corresponding to a static tactile sensation and a frequency band corresponding to a dynamic tactile sensation.

As a result, in a case of reproducing both the static tactile sensation and the dynamic tactile sensation, it is possible to appropriately compress information amount.

In the decoding device according to the present technology described above, it is desirable that the decoding unit decode the coded data in which a frequency of including the representative value extracted from the frequency band corresponding to the static tactile sensation is set lower than a frequency of including the representative value extracted from the frequency band corresponding to the dynamic tactile sensation.

Since the static tactile sensation is given by a low-frequency tactile stimulus, the reproducibility of tactile sensation is unlikely to decrease even if the static tactile sensation is included less frequently in the coded data.

Additionally, the decoding method according to the present technology is a decoding method for decoding coded data obtained by performing coding of compressing information amount by orthogonally transforming a two-dimensional tactile signal based on a time signal.

With such a decoding method, too, an effect similar to that of the above decoding device according to the present technology can be obtained.

Moreover, the decoding-side program according to the present technology is a program that causes an information processing apparatus to achieve a function of decoding coded data obtained by performing coding of compressing information amount by orthogonally transforming a two-dimensional tactile signal based on a time signal.

The decoding device according to the present technology described above is implemented by such a program.

EFFECTS OF THE INVENTION

According to the present technology, it is possible to reduce data amount while ensuring tactile reproducibility of a two-dimensional tactile signal, and improve the efficiency of a system related to tactile reproduction.

Note that the effect described herein is not necessarily limited, and the effect may be any of those described in the present disclosure.

BRIEF DESCRIPTION OF DRAWINGS

FIG. 9 is an explanatory diagram of a coding method as a first example.

FIG. 12 is an explanatory diagram of a coding method as a second example.

FIG. 15 is a diagram showing examples of a neighborhood range of a peak frequency.

FIG. 16 is a diagram showing another example of a neighborhood range of a peak frequency.

FIG. 19 is an explanatory diagram of a coding method as a fifth example.

FIG. 21 is an explanatory diagram regarding the frequency of including representative values of static tactile sensation and dynamic tactile sensation in coded data.

MODES FOR CARRYING OUT THE INVENTION

Hereinafter, embodiments according to the present technology will be described in the following order with reference to the accompanying drawings.

<1. Overview of tactile reproduction system>
<2. Configuration of coding device>
<3. Configuration of decoding device>
<4. Coding and decoding method as embodiment>
[4-1. Human tactile characteristic]
[4-2. Data amount of two-dimensional tactile signal]
[4-3. First example]
[4-4. Second example]
[4-5. Third example]
[4-6. Fourth example]
[4-7. Fifth example]
<5. Summary of Embodiment and Modification>
<6. Present technology>

Here, in the present specification, each term is defined as follows.

Tactile stimulus: A physical phenomenon that causes a person to perceive a tactile sensation, such as a vibration phenomenon.

Tactile presentation: To generate a tactile stimulus.

Tactile information: Information that can be perceived by a tactile sensation, such as vibration information. Tactile information also includes information that is perceptible only in a specific frequency band or amplitude range, such as vibration.

Tactile signal: A signal that represents a tactile stimulus pattern, such as a signal that represents a vibration waveform.

Recipient: The person to which the tactile sensation is presented.

Tactile characteristic: A characteristic regarding human tactile sensations. The tactile characteristic differs among parts (hand, face, foot, and the like) and receptors.

Tactile sensitivity: Sensitivity of how strong a tactile stimulus is subjectively perceived. The tactile sensitivity differs among receptors and parts of the human body.

<1. Overview of Tactile Reproduction System>

Figure 1:
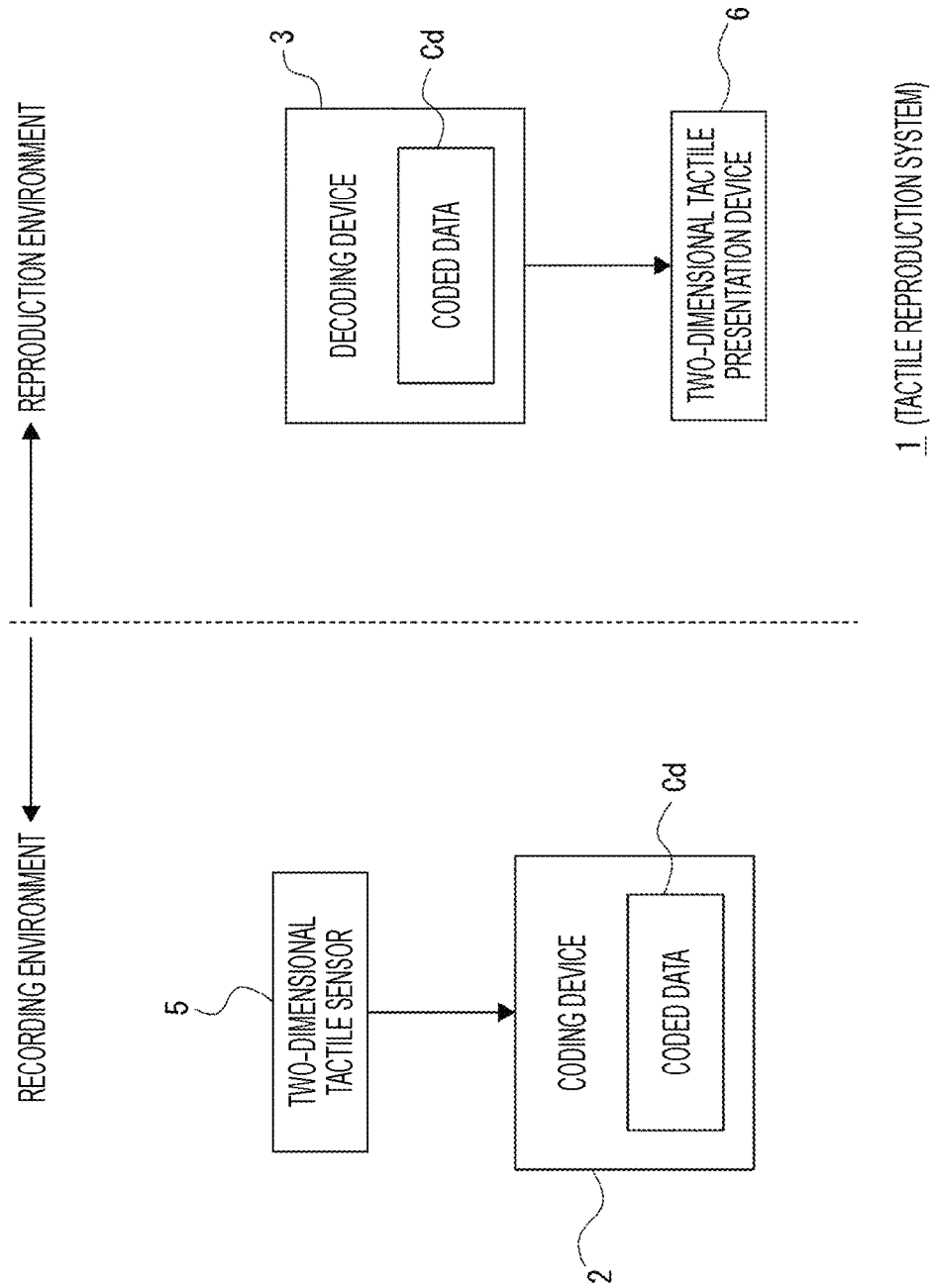
FIG. 1 is a diagram showing a configuration example of a tactile reproduction system including a coding device and a decoding device as an embodiment.

FIG. 1 shows a configuration example of a tactile reproduction system 1 including a coding device 2 and a decoding device 3 as an embodiment of the present technology.

First, in the present embodiment, an environment for achieving tactile reproduction is separated into: a recording environment in which a tactile signal obtained by sensing target tactile information (tactile stimulus) is coded, and coded data Cd obtained by the coding is recorded; and a reproduction environment in which tactile information is reproduced on the basis of a tactile signal obtained by decoding the coded data Cd.

As shown in FIG. 1, the tactile reproduction system 1 includes, in the recording environment, a two-dimensional tactile sensor 5 and the coding device 2 to which the two-dimensional tactile sensor 5 is connected, and includes, in the reproduction environment, the decoding device 3 capable of acquiring the coded data Cd and a two-dimensional tactile presentation device 6 connected to the decoding device 3.

The two-dimensional tactile sensor 5 is a sensor in which multiple detection elements for sensing tactile stimuli are arranged two-dimensionally. In the two-dimensional tactile sensor 5, vibration detection elements such as a piezo pickup and an acceleration sensor are used for each detection element.

In this example, the two-dimensional tactile sensor 5 is used in contact with an object to be sensed, and each detection element outputs vibration or motion as a voltage change.

Note that as the two-dimensional tactile sensor 5, a sensor that senses without coming into contact with an object can also be used.

The coding device 2 includes a computer device such as a central processing unit (CPU) or a digital signal processor (DSP), receives input of a detection signal (tactile signal) by the two-dimensional tactile sensor 5, that is, a two-dimensional tactile signal as a set of tactile signals obtained for each detection element, and records the coded data Cd obtained by coding the two-dimensional tactile signal according to a predetermined data format in an internally provided storage device, for example.

Here, a two-dimensional tactile signal indicates a signal representing a tactile stimulus pattern at multiple positions in a two-dimensional space.

The decoding device 3 includes a computer device such as a CPU or a DSP, decodes the acquired coded data Cd, and drives the two-dimensional tactile presentation device 6 on the basis of a tactile signal obtained by the decoding. For example, the coded data Cd recorded in the recording environment is acquired by the decoding device 3 through an appointed network such as the Internet. Alternatively, the coded data Cd can be recorded on a portable recording medium, and the decoding device 3 can acquire the coded data Cd through the recording medium.

The two-dimensional tactile presentation device 6 is assumed to be a device in which multiple tactile presentation elements as elements for generating tactile stimuli are arranged two-dimensionally. As each tactile presentation element in the two-dimensional tactile presentation device 6, a vibration pin or a micropump is used in this example. Note that the vibration pin has a pin that can be displaced in the length direction and an actuator that drives the pin.

In this example, the two-dimensional tactile presentation device 6 is attached to a predetermined part of the human body of the recipient so as to reproduce the tactile stimulus sensed in the recording environment.

Note that as the two-dimensional tactile presentation device 6, a device that presents tactile sensations without being worn by the recipient can also be used.

Figure 2:
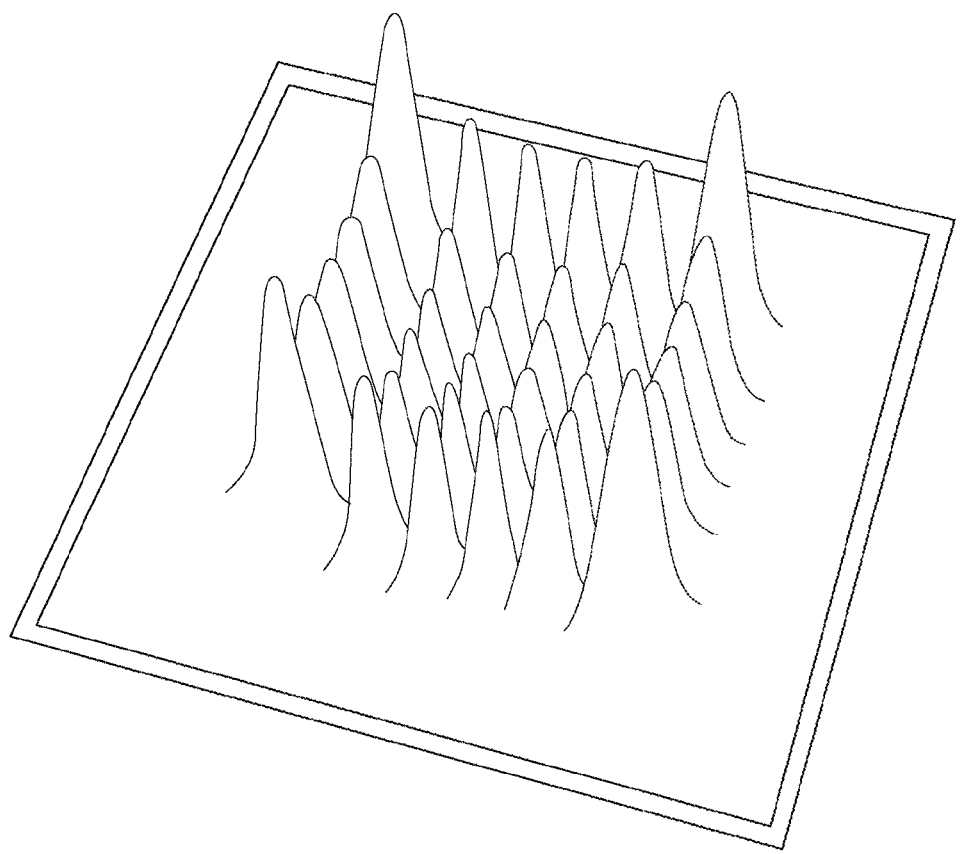
FIG. 2 is an image diagram of two-dimensional vibration.

FIG. 2 is an image diagram of two-dimensional vibration achieved by the two-dimensional tactile presentation device 6.

By using the two-dimensional tactile presentation device 6, it is assumed to be possible to present diverse and complicated tactile sensations.

Here, the tactile reproduction system 1 shown in FIG. 1 is a system adaptable even to a case where the recording environment and the reproduction environment are located remotely.

In a case where the coding device 2 and the decoding device 3 are communicable by communication through a network, for example, the coded data Cd obtained by the coding device 2 can be transmitted to the decoding device 3 in real time. That is, the tactile information sensed in the recording environment can be reproduced in real time.

Note that while FIG. 1 shows an example in which the two-dimensional tactile presentation device 6 is provided separately from the decoding device 3, the two-dimensional tactile presentation device 6 can also be configured integrally with the decoding device 3. Specifically, a tactile presentation device as the two-dimensional tactile presentation device 6 may be built in a mobile terminal such as a smartphone, for example.

<2. Configuration of Coding Device>

Figure 3:
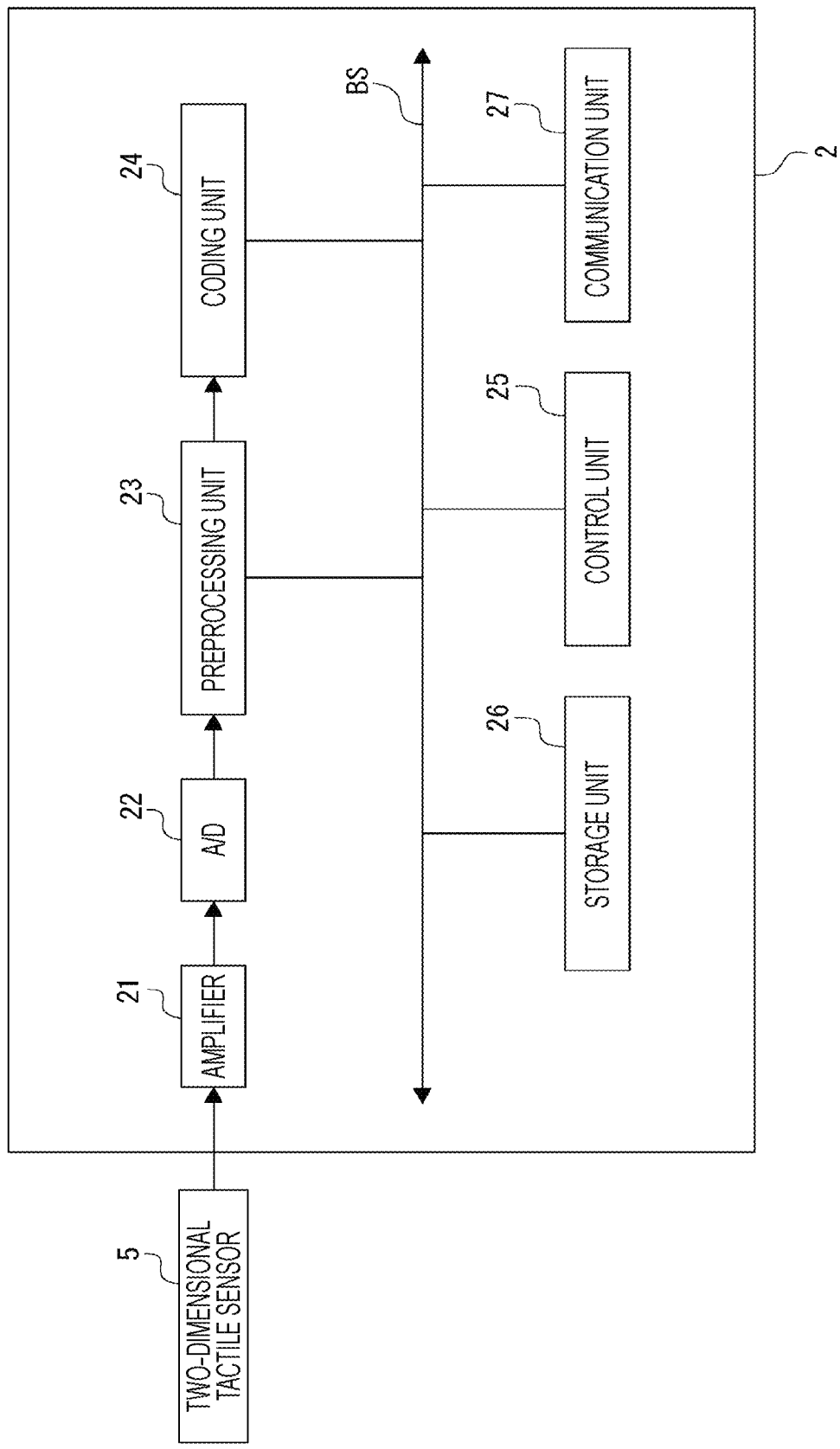
FIG. 3 is a diagram for describing an example of the internal configuration of the coding device as a first embodiment.

FIG. 3 is a diagram for describing an example of the internal configuration of the coding device 2. Note that FIG. 3 shows an example of the internal configuration of the coding device 2 together with the two-dimensional tactile sensor 5 shown in FIG. 1.

As shown in FIG. 3, the coding device 2 includes an amplifier 21, an A/D converter 22, a preprocessing unit 23, a coding unit 24, a control unit 25, a storage unit 26, a communication unit 27, and a bus BS. The preprocessing unit 23, the coding unit 24, the control unit 25, the storage unit 26, and the communication unit 27 are connected through the bus BS and are capable of performing data communication with each other.

The detection signal (two-dimensional tactile signal) of the two-dimensional tactile sensor 5 is input to the amplifier 21 and adjusted to an appropriate dynamic range, and then input to the A/D converter 22 for A/D conversion (analog/digital conversion).

The A/D-converted two-dimensional tactile signal is input to the preprocessing unit 23. The preprocessing unit 23 performs various digital signal processing such as noise removal and calibration of the sensor characteristics of the two-dimensional tactile sensor 5.

The two-dimensional tactile signal subjected to signal processing by the preprocessing unit 23 is input to the coding unit 24.

The coding unit 24 includes a DSP, for example, and codes the input two-dimensional tactile signal according to a predetermined data format to obtain the coded data Cd described above.

Note that the coding of the tactile signal as the present embodiment will be described later.

The control unit 25 includes a microcomputer having a CPU, a read only memory (ROM), a random access memory (RAM), and the like, for example, and performs overall control of the coding device 2 by performing processing according to a program stored in the ROM.

For example, the control unit 25 performs data communication with an external device through the communication unit 27.

The communication unit 27 is capable of performing data communication with an external device through a network such as the Internet, and the control unit 25 is capable of performing data communication with the external device connected to the network through the communication unit 27. In particular, the coded data Cd obtained by the coding unit 24 can be transmitted to the external device through the communication unit 27.

The storage unit 26 comprehensively represents a storage device such as a hard disk drive (HDD) or a solid state drive (SSD), and is used for storing various data in the coding device 2. For example, the storage unit 26 stores data necessary for control by the control unit 25. Additionally, based on the control of the control unit 25, the coded data Cd obtained by the coding unit 24 can be stored in the storage unit 26.

<3. Configuration of Decoding Device>

Figure 4:
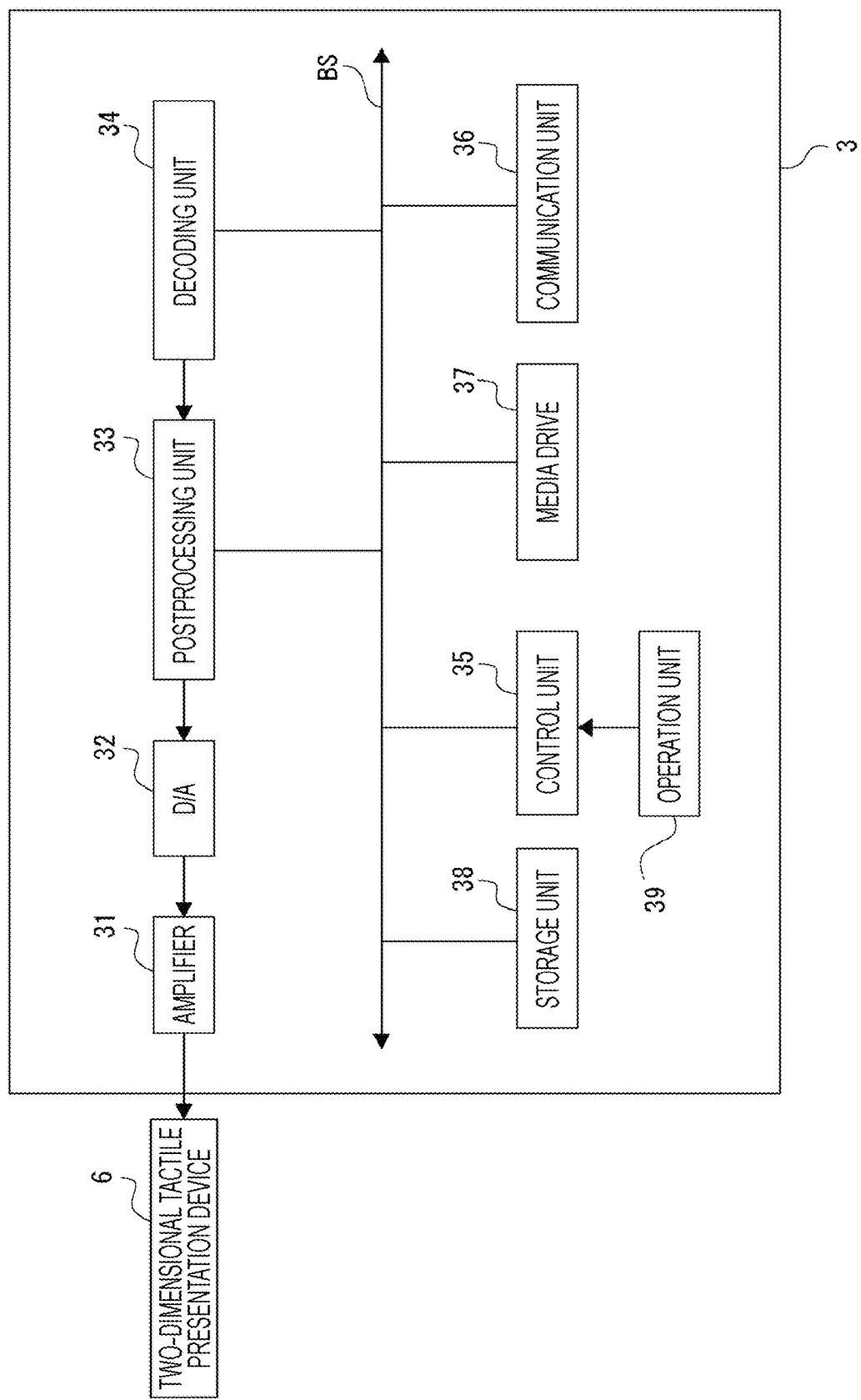
FIG. 4 is a diagram for describing an example of the internal configuration of the decoding device as the first embodiment.

FIG. 4 is a diagram for describing an example of the internal configuration of the decoding device 3, and shows the two-dimensional tactile presentation device 6 shown in FIG. 1 together with the example of the internal configuration of the decoding device 3.

As shown in FIG. 4, the decoding device 3 includes an amplifier 31, a D/A converter 32, a postprocessing unit 33, and a decoding unit 34, as well as a control unit 35, a communication unit 36, a media drive 37, a storage unit 38, and an operation unit 39. The postprocessing unit 33, the decoding unit 34, the control unit 35, the communication unit 36, the media drive 37, and the storage unit 38 are connected through the bus BS and are capable of performing data communication with each other.

The control unit 35 includes a microcomputer having a CPU, a ROM, a RAM, and the like, for example, and performs overall control of the decoding device 3 by performing processing according to a program stored in the ROM.

The communication unit 36 is capable of performing data communication with an external device through a network such as the Internet. The control unit 35 is capable of performing data communication with an external device connected to the network through the communication unit 36. In particular, the communication unit 36 can receive the coded data Cd from an external device such as the coding device 2 or a server device on the network.

The media drive 37 allows a portable recording medium to be attached thereto and detached therefrom, and is configured as a reader/writer unit that enables data to be written to and read from an attached recording medium. Examples of the recording medium supported by the media drive 37 include a memory card (e.g., portable flash memory), an optical disk recording medium, and the like.

The media drive 37 makes it possible to read the coded data Cd recorded on the portable recording medium.

The storage unit 38 comprehensively represents a storage device such as an HDD or an SSD, and is used for storing various data in the decoding device 3. For example, the storage unit 38 stores data necessary for control by the control unit 35. Additionally, under the control of the control unit 35, the coded data Cd read by the media drive 37 and the coded data Cd received from the external device by the communication unit 36 can be stored in the storage unit 38 as well.

The operation unit 39 comprehensively represents various operators provided in the decoding device 3, and outputs, to the control unit 35, operation input information according to the operation input.

The control unit 35 performs processing according to the operation input information. As a result, the decoding device 3 achieves a motion according to the operation input.

The coded data Cd is input to the decoding unit 34 under the control of the control unit 35.

The decoding unit 34 decodes the input coded data Cd by a method described later to obtain a two-dimensional tactile signal. The two-dimensional tactile signal obtained by the decoding unit 34 is input to the postprocessing unit 33.

The postprocessing unit 33 performs signal processing such as calibration of the two-dimensional tactile presentation device 6 and predetermined filter processing on the input two-dimensional tactile signal as necessary.

The two-dimensional tactile signal having passed through the postprocessing unit 33 is input to the D/A converter 32 for D/A conversion (digital/analog conversion), and then adjusted to an appropriate dynamic range by the amplifier 31 to be output to the two-dimensional tactile presentation device 6.

As a result, the two-dimensional tactile presentation device 6 is driven on the basis of the two-dimensional tactile signal, and the tactile stimulus targeted for sensing in the recording environment can be given to the recipient (i.e., tactile information can be reproduced).

Note that although only the tactile signal is mentioned above, it is also possible to record an audio signal and a video signal together with the tactile signal and provide sound and video together with the tactile information to the recipient.

<4. Coding and Decoding Method as Embodiment>

[4-1. Human Tactile Characteristic]

First, the human tactile characteristic will be described prior to the description of specific methods of coding and decoding as embodiments.

Figure 5:
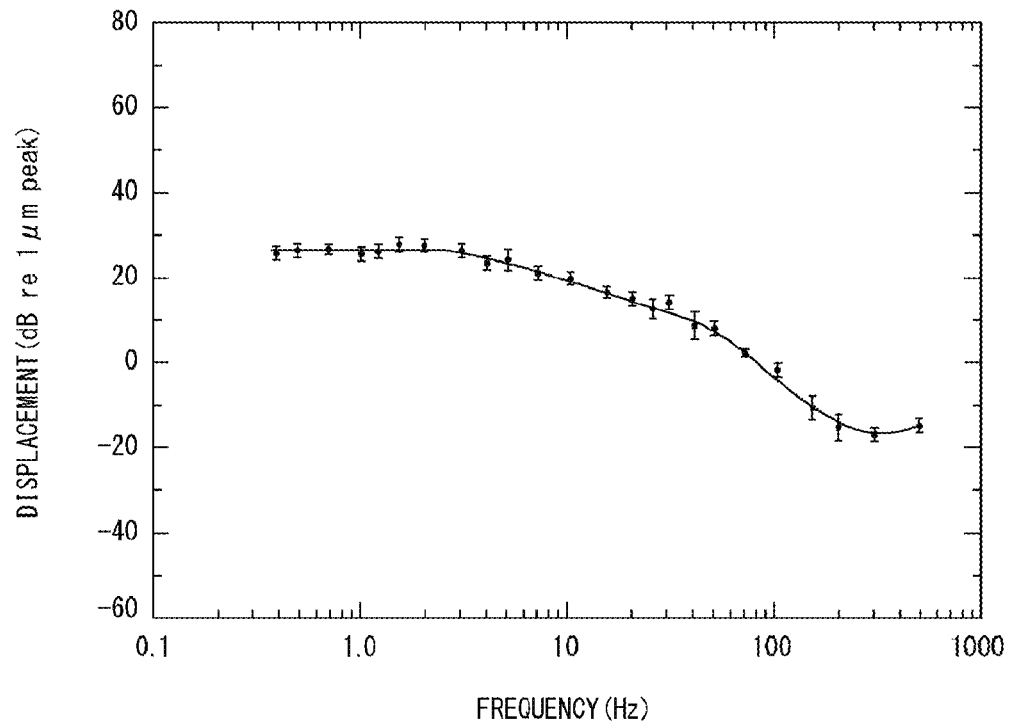
FIG. 5 is an explanatory diagram of a vibration detection threshold curve.

A vibration detection threshold curve shown in FIG. 5 has been reported as a measure of human tactile sensitivity. Note that in FIG. 5, the horizontal axis represents the frequency and the vertical axis represents the magnitude of the tactile stimulus (vibration: displacement in this case).

The vibration detection threshold curve shown in FIG. 5 is an example of experimentally examining whether or not a human feels the vibration as a tactile sensation, that is, the tactile sensitivity. Humans cannot perceive vibrations smaller than this curve as tactile sensations.

Here, it is generally known that there are multiple receptors for perceiving tactile sensations under the human skin. Meissner, Merkel, Ruffini, and Pacinian are known as typical receptors.

Meissner and Pacinian are also referred to as "FA 1" and "FA 2", respectively, where FA is an abbreviation for "Fast Adapting". Merkel and Ruffini are also referred to as "SA 1" and "SA 2", respectively, where SA is an abbreviation for "Slow Adapting".

Figure 6:
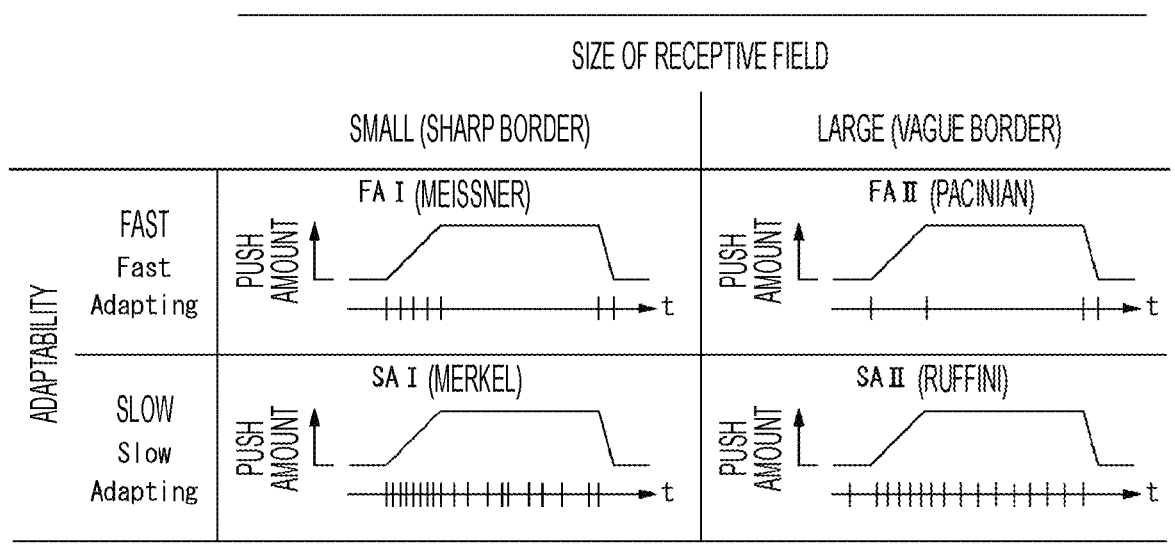
FIG. 6 is a diagram showing an example of a neuronal firing distribution for each receptor.

FIG. 6 shows a neuronal firing distribution for each receptor when an object is gradually pressed against the skin, held for a while, and then released.

Merkel (SA 1) continuously ignites nerves while the object is pressed thereagainst, and is said to detect intensity (displacement, pressure). Meissner (FA 1) is said to detect the period until the amount of pushing of the object becomes constant, that is, velocity. Pacinian (FA 2) is said to detect the period during which the amount of pushing changes, that is, acceleration.

Figure 7:
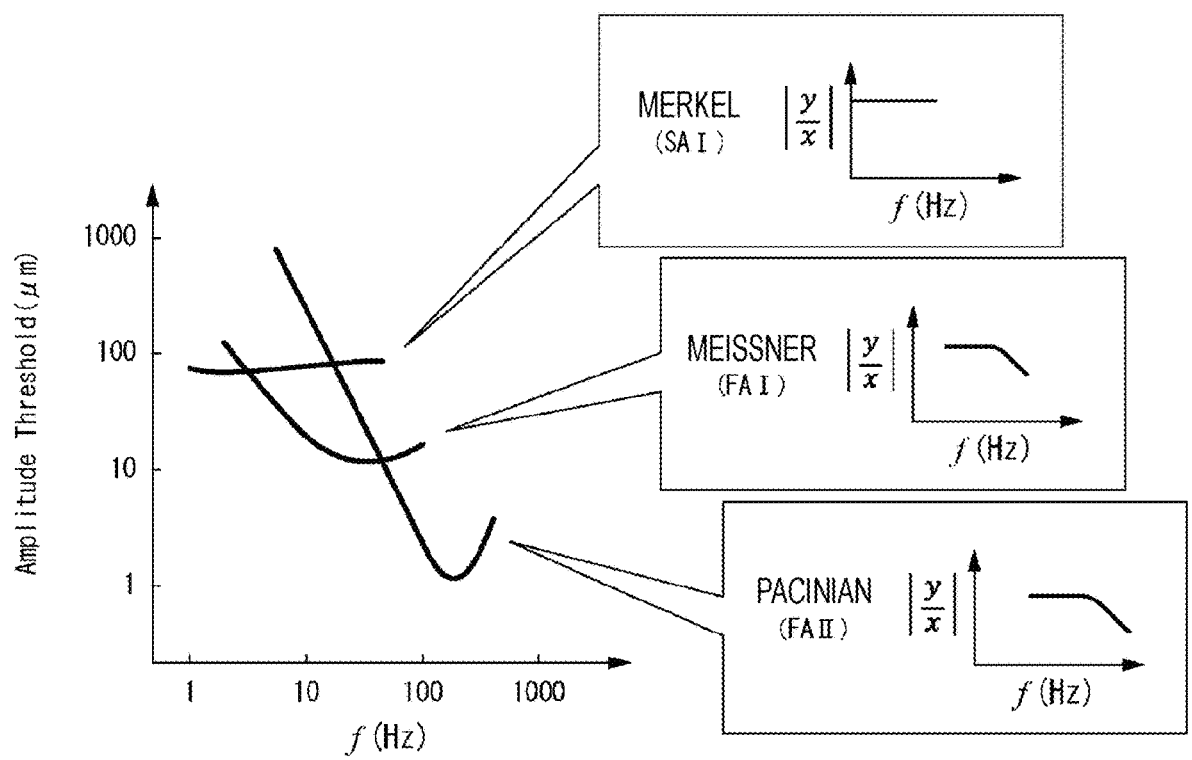
FIG. 7 is an explanatory diagram of a vibration detection threshold curve for each receptor.

FIG. 7 shows a vibration detection threshold curve for each receptor. The curve shown in FIG. 5 does not show the characteristic of a single receptor, but shows a characteristic as a result of a synthesis of tactile sensations obtained by multiple receptors shown in FIG. 7.

From the vibration detection threshold curves shown in FIGS. 5 and 7, it is shown that humans can perceive vibrations up to about 1 kHz as tactile stimuli. Additionally, while values of 1 kHz or higher are not shown in these diagrams, it is known that humans can actually perceive vibration as a tactile stimulus even with vibration at a frequency of about several kHz, although the sensitivity is not high.

In most conventional tactile reproduction applications, vibrations up to about 200 Hz are targeted. This is due to the fact that the human tactile sensitivity is the highest around 200 Hz.

However, as mentioned above, it has been clarified from various past experiments that humans can perceive vibrations up to 1 kHz as tactile stimuli, and it is difficult to reproduce highly realistic tactile sensations with conventional applications.

For example, the vibration that occurs when a bottle is uncorked actually contains a high frequency of several kHz. If this is reproduced only up to several hundred Hz, only a tactile sensation that is completely different from reality can be obtained.

In view of this point, the present embodiment adopts a method of sensing a tactile stimulus such as vibration that has actually occurred to obtain a tactile signal, and presenting a tactile sensation by the tactile signal.

[4-2. Data Amount of Two-Dimensional Tactile Signal]

In recent years, all kinds of information have been digitized for use, and digitization of tactile signals is similarly considered.

The amount of digitized data can be considered in terms of the number of bits required per unit time, that is, the bit rate. For example, in the vibration detection threshold curve shown in FIG. 5, the region that humans can perceive is at least 50 dB (−20 dB to 30 dB) or more on the vertical axis (vibration) and about 1000 Hz on the horizontal axis. In this example, considering the distribution of tactile information actually felt by humans, signals in the range of +20 dB from the threshold curve are to be sensed. Specifically, the vibration range is 70 dB (−20 dB to 50 dB).

In a case of digitizing this signal by linear pulse code modulation (LPCM), since 1 bit can express 6 dB, the vertical axis is 9 bits, and the sampling frequency needs to be doubled, that is, 2000 Hz (sample/sec) is required for reproduction up to 1000 Hz. Hence, a required bit rate B0 can be obtained by the following [Equation 1].

$$B0 = 9 \text{ bit/sample} \times 2000 \text{ sample/sec} = 18 \text{ kbit/sec} \quad \text{[Equation 1]}$$

This value itself is extremely small compared to the bit rate of a compact disc (CD)=700 kbps/ch, which is a typical format for an audio signal, for example. Accordingly, even if this tactile signal is additionally incorporated into some system, it seems unlikely that it will be a big problem.

However, as indicated above, it is known that the band of the tactile signal that can be perceived by humans extends to several kHz. For example, in a case of reproducing a tactile signal up to 2000 Hz, the bit rate is 36 kbit/sec, which is twice that of [Equation 1].

Additionally, the bit rate of the two-dimensional tactile signal in the case of using the two-dimensional tactile presentation device 6 as in this example is further increased. Specifically, assuming that the number of tactile presentation elements in the two-dimensional tactile presentation device 6 is n in each of the vertical and horizontal directions, a bit rate Bn of the two-dimensional tactile signal is as shown in the following [Equation 2]. Note that "^" means power.

$$Bn = 9 \text{ bit/sample} \times 2000 \text{ sample/sec} \times n^2 \quad \text{[Equation 2]}$$

That is, if n=8, for example, the bit rate is Bn=1.152 Mbps (almost the same as CD audio).

The above is the bit rate of only simple payload information, and it is obvious that the bit rate will be about 1.5 to 2 Mbps in the case of a bit stream for transmission. Although this transmission is not difficult if it is wired, in a case of considering a system in which the decoding device 3 is attached to the recipient, for example, the recipient may feel the inconvenience due to wired transmission such as being restricted from freely moving around. Hence, wireless transmission is desirable.

As for wireless transmission, while transmission by Wi-Fi (registered trademark) is considered to be suitable for the bit rate Bn described above, commercialization is difficult from the viewpoint of power consumption and delay. Meanwhile, with power-saving communication such as Bluetooth (registered trademark), smooth transmission is difficult due to lack of bandwidth.

[4-3. First Example]

Hence, in the present embodiment, the efficiency of a system related to tactile reproduction is improved by reducing data amount while ensuring tactile reproducibility of a two-dimensional tactile signal.

Here, in a case where a tactile signal based on a time signal is directly input to each tactile presentation element of the two-dimensional tactile presentation device 6, complete control including that each tactile presentation element operates independently and without any correlation can be performed. However, in actual tactile presentation, the tactile presentation elements cooperate to generate a vibration wave surface of the presenting surface, so that the tactile presentation elements inevitably operate in a correlated manner. In this sense, it is considered redundant to perform vibration presentation by independent time signal input to each tactile presentation element.

This situation is similar for stimulus expressions for other sensory organs, and the most obvious is the stimulus expression for vision, that is, high-efficiency expression of images. In an image perceived as a meaningful image, the brightness change between one pixel and its neighboring pixel is relatively subtle, and the importance for expressing an object shape in the image differs depending on the pixel. As described above, there is usually a large correlation between the pixels in an image, and therefore the representation can be modeled to some extent.

In the present embodiment, the problem is solved by applying this modeling to the vibration expression for tactile presentation. That is, a two-dimensional tactile signal is regarded in a similar manner as an image signal, and high-efficiency coding and decoding are performed in a similar manner as in the case of an image signal.

In image signals, expressions based on sine waves are often applied, and in particular, the two-dimensional discrete cosine transform (DCT), which is an orthogonal transform using cosine waves, is widely used. [Equation 3] shows the transformation formula by DCT-II as an example of the transformation formula by two-dimensional DCT.

[Expression 1]

$$X(k, l) = \frac{2}{N} c_k c_l \sum_{n=0}^{N-1} \sum_{m=0}^{N-1} x(n, m) \cos\left\{\frac{\pi}{N} k\left(n + \frac{1}{2}\right)\right\} \cos\left\{\frac{\pi}{N} l\left(m + \frac{1}{2}\right)\right\} \quad \text{(Equation 3)}$$

-continued $$c_k = \begin{cases} 1/\sqrt{2} & (k = 0) \\ 1 & (k \neq 0) \end{cases}$$

$$c_l = \begin{cases} 1/\sqrt{2} & (l = 0) \\ 1 & (l \neq 0) \end{cases}$$

For image data, x(n, m) is the brightness (or color difference signal) at a pixel (n, m) in a DCT block when an image is divided into DCT blocks in units of N×N pixels (N is natural number of 2 or more), and a DCT coefficient X (k, l) is its spatial frequency representation. Human vision is sensitive to change in brightness, especially in its low-frequency components. Since it is in the nature of DCT to efficiently concentrate the energy of a time signal on the low-frequency side of the spectrum, it is possible to code that region alone, and remove other regions without causing much unnaturalness.

Here, regarding the two-dimensional tactile presentation, considering the tactile characteristics shown in FIGS. 5 and 7, it can be said that processing similar to the case of vision can be performed. For this reason, in the present embodiment, coding is performed to compress information amount by orthogonally transforming a two-dimensional tactile signal based on a time signal. Specifically, coding is performed to compress information amount by analyzing a two-dimensional spectrum (orthogonal transform coefficient: DCT coefficient X (k, l) in the case of DCT) obtained by orthogonally transforming a two-dimensional tactile signal based on a time signal.

The DCT coefficient X (k, l) represents the spatial frequency component on the k-axis and l-axis after the orthogonal transform.

Figure 8:
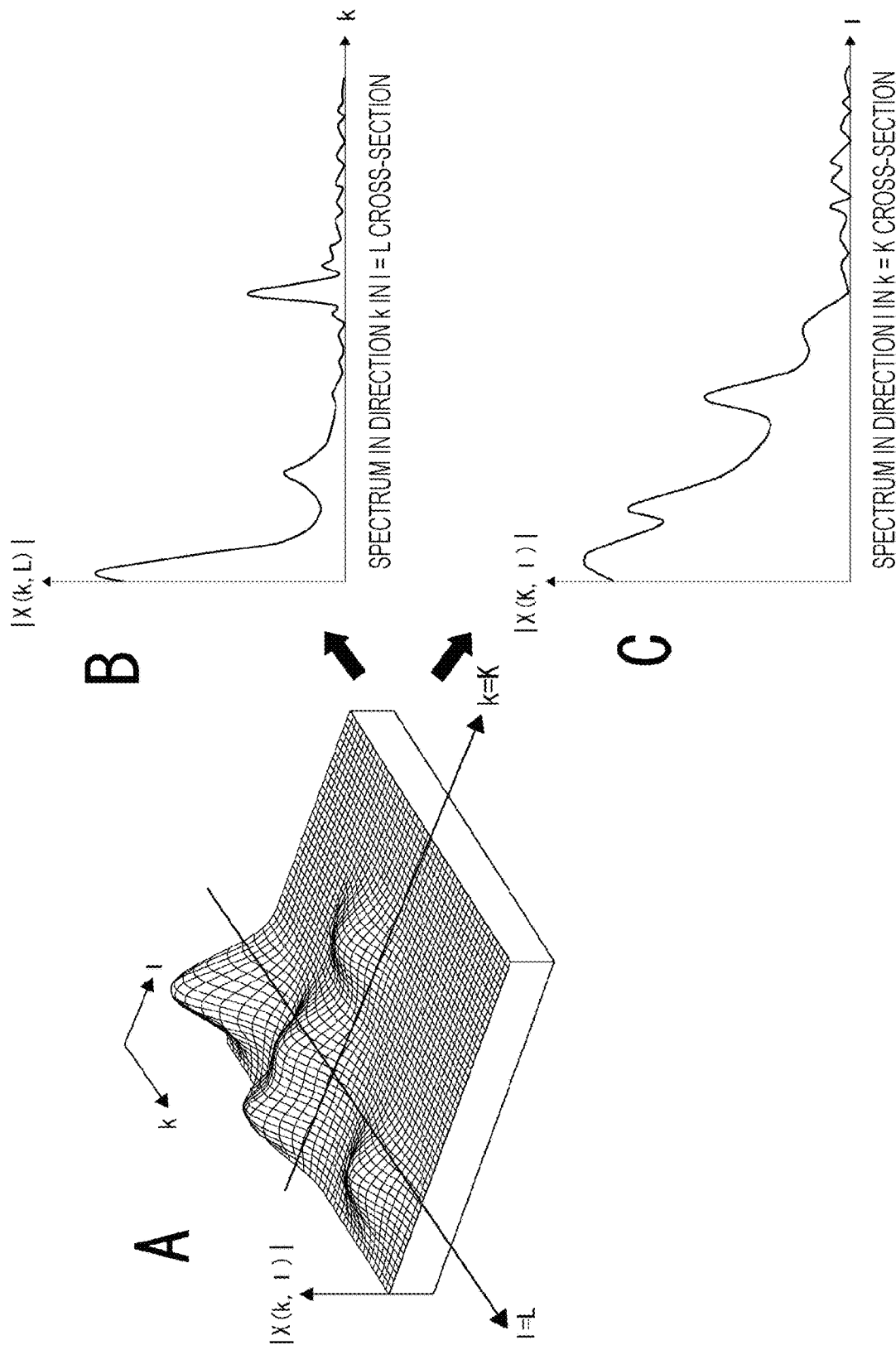
FIG. 8 is an explanatory diagram of a two-dimensional spectrum obtained by orthogonal transform.

FIG. 8A shows a sensory three-dimensional diagram of the DCT coefficient X (k, l) as an example of the two-dimensional spectrum obtained by the orthogonal transform.

FIGS. 8B and 8C show the two-dimensional spectrum shown in FIG. 8A viewed in cross-sections parallel to the k-axis and the l-axis, which are orthogonal axes forming the two-dimensional plane. Note that in each of FIGS. 8A to 8C, the DCT coefficient X (k, l) is converted into an absolute value.

A major advantage of the method of orthogonally transforming a two-dimensional tactile signal is that the original tactile stimulus pattern can be reproduced almost faithfully by coding only the spectrum on the low-frequency side.

Here, while DCT is illustrated as an orthogonal transform for a two-dimensional tactile signal in the embodiment, KL transform, Hadamard transform, or the like can also be adopted, and the specific method of orthogonal transform can be freely selected depending on the purpose and conditions.

In a first example, a method of compressing information amount by extracting low-frequency components from a two-dimensional spectrum obtained by orthogonal transform is adopted. That is, in view of the above-mentioned advantage of orthogonal transform, only the low-frequency component is extracted as the main component, and the other components are removed.

FIG. 9 is an explanatory diagram of a coding method as the first example.

In the first example, an upper limit frequency Ic is specified in order to set the upper limit of the frequency index of the spectrum to be extracted.

Then, as shown by the shaded area in FIG. 9, only the spectrum with the frequency index equal to or below the upper limit frequency Ic (i.e., DCT coefficient X (k, l)) is extracted as the object of quantization. That is, the spectrum is extracted as a spectrum to be included in the coded data Cd.

Here, the value of the upper limit frequency Ic can be a value that matches the human tactile characteristic and the frequency characteristic of the two-dimensional tactile presentation device 6 (each tactile presentation element).

For example, the response frequency of the receptor is about 5 to 15 Hz for Merkel, about 20 to 50 Hz for Meissner, and about 100 to 300 Hz for Pacinian. Hence, in a system that covers all of the above frequencies, it is conceivable to set the upper limit frequency Ic to about 500 Hz.

Additionally, in a case of matching the frequency characteristic of the two-dimensional tactile presentation device 6, the response characteristics of the tactile presentation element are about 1 to 300 Hz for an eccentric motor (ERM), which is a typical element, about 200 Hz for a linear resonance actuator (LRA), and about 1 to 300 Hz for a piezo element. It is only necessary to determine the upper limit frequency Ic on the basis of these values.

Note that the value of the upper limit frequency Ic can also be set according to the characteristic of the transmission line.

A configuration for implementing a coding and decoding method as the first example will be described with reference to FIGS. 10 and 11.

Figure 10:
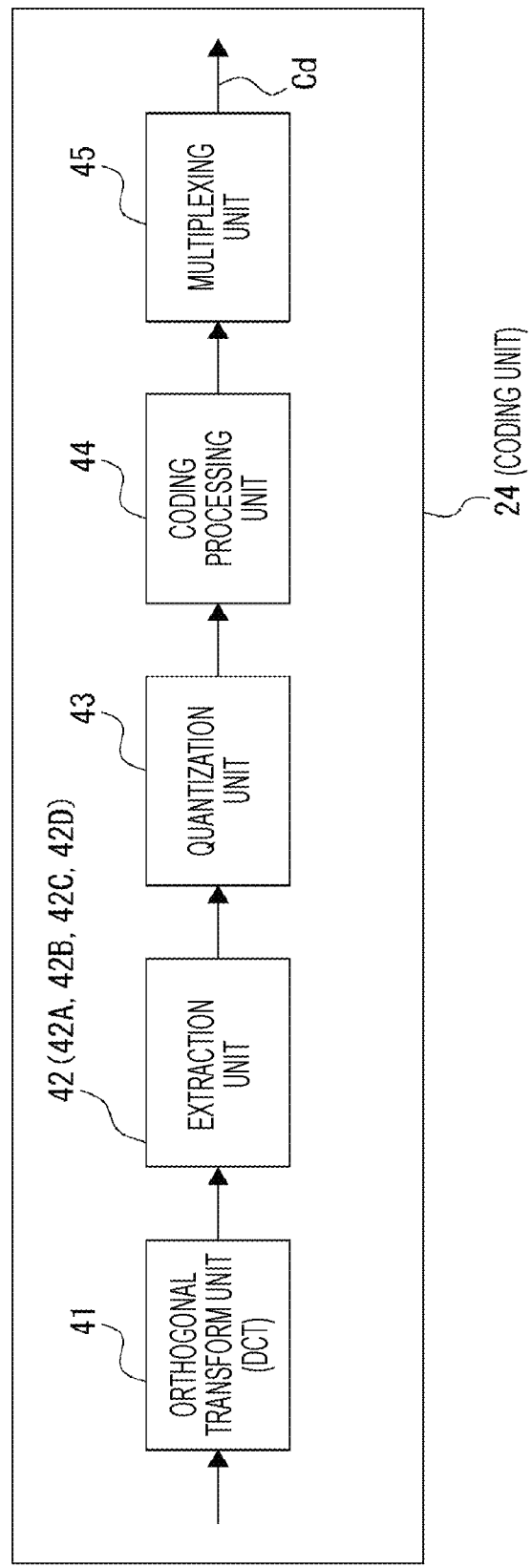
FIG. 10 is a block diagram showing an example of the internal configuration of a coding unit included in the coding device as the embodiment.

FIG. 10 is a block diagram showing an example of the internal configuration of the coding unit 24 included in the coding device 2.

As shown in FIG. 10, the coding unit 24 includes an orthogonal transform unit 41, an extraction unit 42, a quantization unit 43, a coding processing unit 44, and a multiplexing unit 45.

A two-dimensional tactile signal based on a time signal is input to the orthogonal transform unit 41 from the preprocessing unit 23 shown in FIG. 3.

The orthogonal transform unit 41 performs orthogonal transform on the two-dimensional tactile signal based on a time signal to obtain a two-dimensional spectrum. Specifically, the orthogonal transform unit 41 of this example transforms a two-dimensional tactile signal based on a time signal into a two-dimensional spectrum with respect to a two-dimensional DCT basis.

Note that It is not essential to divide the two-dimensional tactile signal into multiple DCT blocks, and the two-dimensional tactile signal can be orthogonally transformed as a single DCT block. Examples of such a case include a case where a two-dimensional tactile signal includes 64 values of 8×8, and the DCT block is an 8×8 block.

The extraction unit 42 analyzes the two-dimensional spectrum obtained by the orthogonal transform by the orthogonal transform unit 41, and extracts the spectrum to be included in the coded data Cd. Specifically, the extraction unit 42 in the first example extracts only the DCT coefficient X (k, l) based on a frequency index (both k-axis and l-axis) equal to or below the upper limit frequency Ic among the DCT coefficients X (k, l) obtained by orthogonal transform, and outputs the DCT coefficient X (k, l) to the quantization unit 43.

The quantization unit 43 quantizes the DCT coefficient X (k, l) output from the extraction unit 42.

The coding processing unit 44 performs entropy coding such as Huffman coding on the DCT coefficient X (k, l) quantized by the quantization unit 43, and outputs the result to the multiplexing unit 45.

The multiplexing unit 45 performs multiplexing processing on the data of the DCT coefficient X (k, l) coded by the coding processing unit 44, and generates the coded data Cd including stream data. Note that stream data is data in which frames including a header area and an actual data area are arranged in the time direction, for example.

Figure 11:
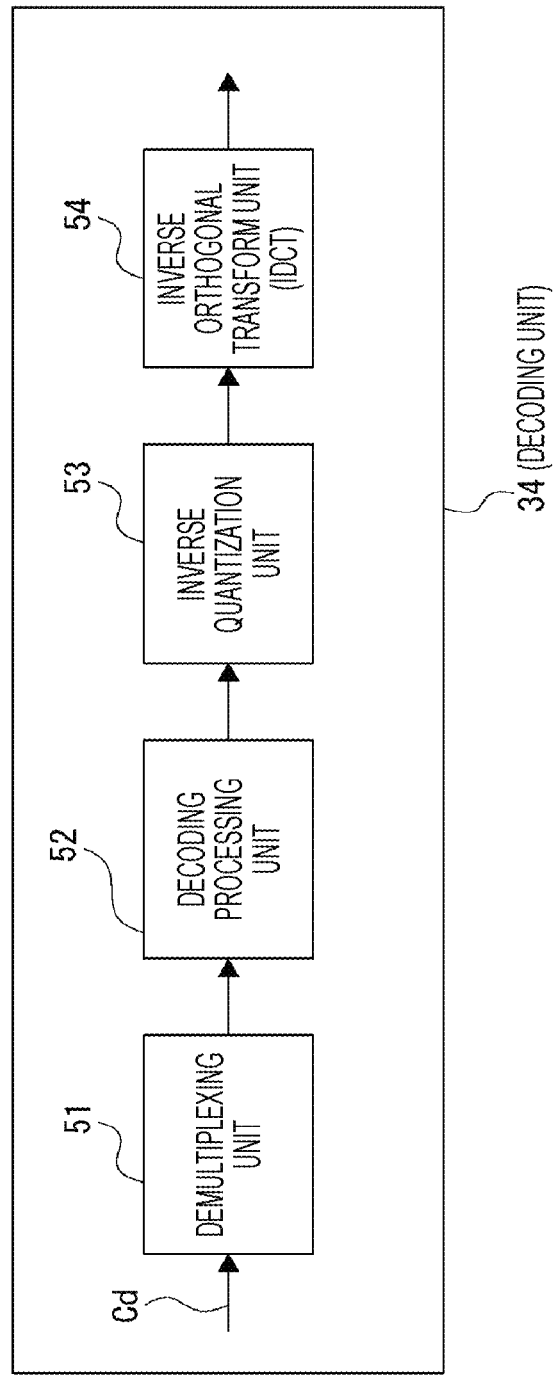
FIG. 11 is a block diagram showing an example of the internal configuration of a decoding unit included in the decoding device according to the embodiment.

FIG. 11 is a block diagram showing an example of the internal configuration of the decoding unit 34 included in the decoding device 3.

The decoding unit 34 includes a demultiplexing unit 51, a decoding processing unit 52, an inverse quantization unit 53, and an inverse orthogonal transform unit 54.

The demultiplexing unit 51 receives input of the coded data Cd including stream data generated by the multiplexing unit 45, and performs demultiplexing processing. By this separation processing, the entropy-coded DCT coefficient X (k, l) is separated and extracted from the stream data.

The decoding processing unit 52 receives input of the DCT coefficient X (k, l) obtained by the demultiplexing unit 51, decodes the entropy code, and outputs the DCT coefficient X (k, l) to the inverse quantization unit 53.

The inverse quantization unit 53 performs inverse quantization on the DCT coefficient X (k, l) decoded by the decoding processing unit 52, and outputs the DCT coefficient X (k, l) to the inverse orthogonal transform unit 54.

The inverse orthogonal transform unit 54 performs an inverse orthogonal transform (IDCT) on the DCT coefficient X (k, l) input from the inverse quantization unit 53, and obtains a two-dimensional tactile signal based on a time signal.

The two-dimensional tactile signal obtained by the inverse orthogonal transform unit 54, that is, the signal representing the tactile stimulus pattern for each tactile presentation element in the two-dimensional tactile presentation device 6, is transmitted through the postprocessing unit 33 shown in FIG. 4, converted into an analog signal by the D/A converter 32, and then is amplified by the amplifier 31 to be input to the two-dimensional tactile presentation device 6.

Here, in the first example, it can be said that the coded data Cd is coded data in which information amount is compressed by extracting the low-frequency component. That is, it can be said that the decoding device 3 as the first example that decodes such coded data Cd is a decoding device that decodes coded data in which information amount is compressed by extracting the low-frequency component.

Additionally, depending on how the upper limit frequency Ic is determined, the first example can be a method of compressing information amount on the basis of the human tactile characteristic. For example, the case of setting the upper limit frequency Ic to about 500 Hz in consideration of the characteristics of the receptors as described above is an example of such a case.

Similarly, depending on how the upper limit frequency Ic is determined, the first example may also be a method of compressing information amount on the basis of the device characteristic, which is the frequency characteristic of the tactile presentation device.

[4-4. Second Example]

In order to compress information amount, it is possible to adopt a method of extracting only the spectrum having a large absolute value regardless of the frequency band.

FIG. 12 is an explanatory diagram of a coding method as a second example.

In the second example, a DCT coefficient X (k, l) whose absolute value is equal to or greater than a threshold Sth is extracted as the main component of the spectrum.

The threshold Sth is not limited to a single value, and different values can be set according to the frequency as illustrated in FIG. 12. In FIG. 12, as an example of such a threshold Sth, a threshold Sth determined on the basis of the human tactile characteristic is illustrated. The drop in the threshold Sth in FIG. 12 corresponds to the drop around 100 Hz in the vibration detection threshold curve shown in FIG. 5.

According to this method as the second example, it is possible to extract frequency components that are presumed to be easily perceived by humans in terms of the size of the spectrum and remove other components, thereby reducing data amount while ensuring tactile reproducibility.

Additionally, a strong spectrum that appears in a region other than the low-frequency band clearly expresses the characteristic of vibration that cannot be expressed only in the low-frequency band, and efficient coding including such a spectrum greatly contributes to achieving reproduction of a more realistic tactile sensation. According to the method as the second example, it is possible to extract such a strong spectrum that appears in a region other than the low-frequency band, and therefore it is possible to improve tactile reproducibility.

In the case of the second example, a coding unit 24 is provided with an extraction unit 42A instead of the extraction unit 42 (see FIG. 10).

The extraction unit 42A outputs, to a quantization unit 43, only the DCT coefficient X (k, l) whose absolute value is equal to or greater than the threshold Sth among the DCT coefficients X (k, l) obtained by orthogonal transform by an orthogonal transform unit 41. At this time, if the value of the threshold Sth differs depending on the frequency, the magnitude relationship with the absolute value of the DCT coefficient X (k, l) is compared using the corresponding threshold Sth for each frequency index.

Here, in the second example, it can be said that coded data Cd is coded data in which information amount is compressed by extracting the frequency component whose absolute value of the orthogonal transform coefficient is equal to or greater than a threshold. That is, it can be said that a decoding device 3 as the second example that decodes such coded data Cd is a decoding device that decodes coded data in which information amount is compressed by extracting the frequency component whose absolute value of the orthogonal transform coefficient is equal to or greater than a threshold.

[4-5. Third Example]

In a two-dimensional spectrum obtained by orthogonal transform, a frequency band in which a main component having a large spectrum is obtained does not always match a frequency band in which the sensitivity of a receptor is good. If there is a band in the vicinity of a main component that includes the peak of a frequency characteristic of a receptor, the main component can be virtually shifted or deformed to efficiently present a tactile sensation according to a tactile characteristic.

A specific example of a coding method as a third example will be described with reference to FIG. 13. Note that here, an example of a coding method considering the tactile characteristic of two receptors R1 and R2 will be described.

Figure 13:
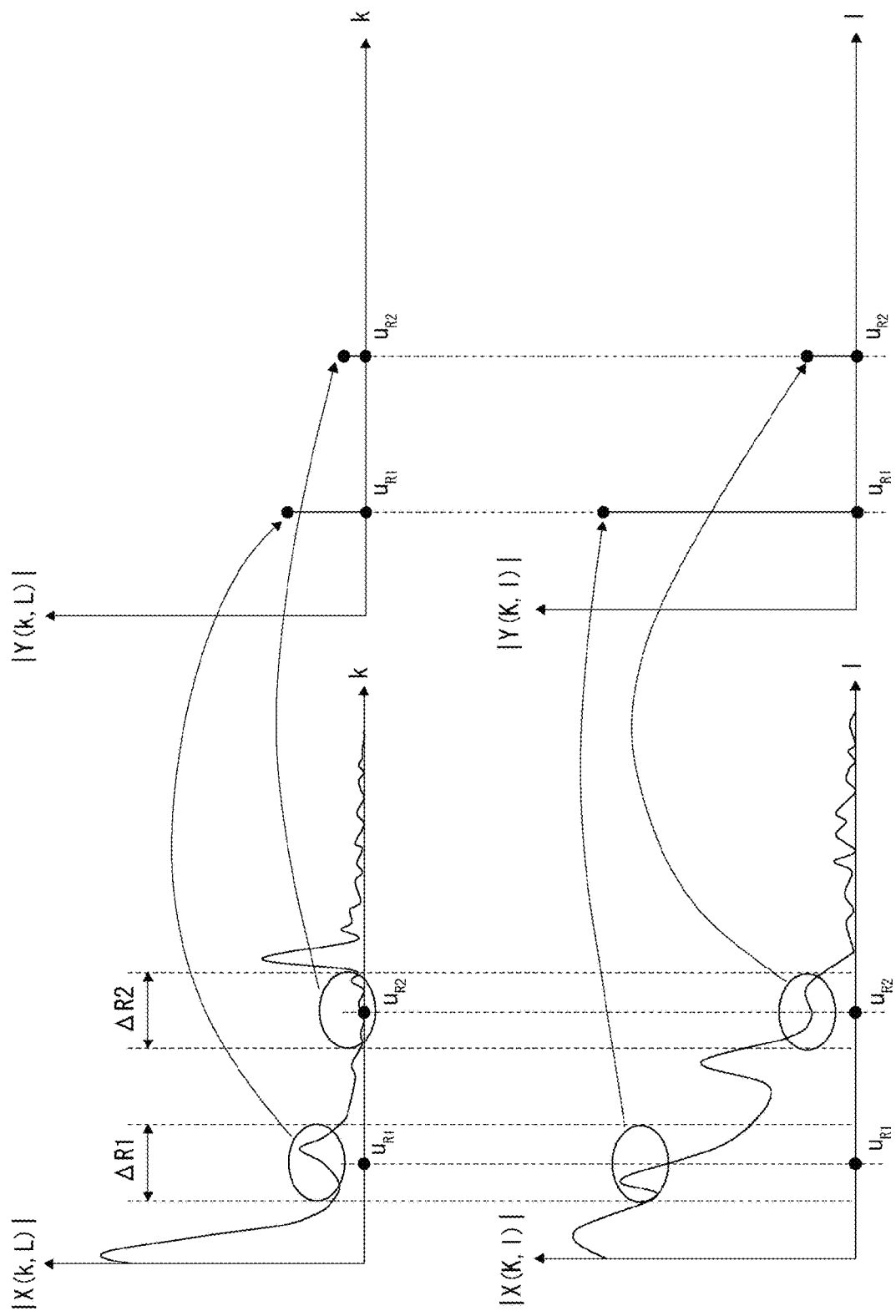
FIG. 13 is an explanatory diagram of a coding method as a third example.

Peak frequencies $u_{R1}$ and $u_{R2}$ in FIG. 13 represent peak frequencies of the sensitivities of receptors R1 and R2, respectively. Additionally, neighborhood ranges $\Delta R1$ and $\Delta R2$ in FIG. 13 are frequency ranges defined as the neighborhood ranges of the peak frequencies $u_{R1}$ and $u_{R2}$, respectively.

In the third example, the representative value of a DCT coefficient X (k, l) is extracted in the neighborhood ranges ΔR1 and ΔR2 of the peak frequencies $u_{R1}$ and $u_{R2}$, respectively. Here, as the representative value, extracted is a representative value of the DCT coefficient X (k, l) in the target frequency range (here, in neighborhood range ΔR), such as a weighted average value, a median value, or a maximum value of the DCT coefficient X (k, l) in the frequency range.

Note that regarding Y (k, L) and Y (K, l) in FIG. 13, Y (k, l) indicates the DCT coefficient extracted from the DCT coefficient X (x, l) obtained by orthogonal transform.

At this time, a frequency index corresponding to a peak frequency u is assigned to a frequency index of the extracted DCT coefficient X (k, l). Here, the frequency index corresponding to the peak frequency u indicates a frequency index representing a frequency that matches the peak frequency u in a case where the peak frequency u matches the frequency represented by any frequency index (hereinafter referred to as index frequency), and indicates a frequency index having the smallest frequency difference from the peak frequency u in a case where the peak frequency u does not match any index frequency.

In the example of FIG. 13, assuming that the peak frequencies $u_{R1}$ and $u_{R2}$ each match an index frequency, it is shown that the frequency indexes of the peak frequencies $u_{R1}$ and $u_{R2}$ are assigned as the frequency indexes of the DCT coefficient X (k, l) extracted for the neighborhood ranges ΔR1 and ΔR2, respectively.

Figure 14:
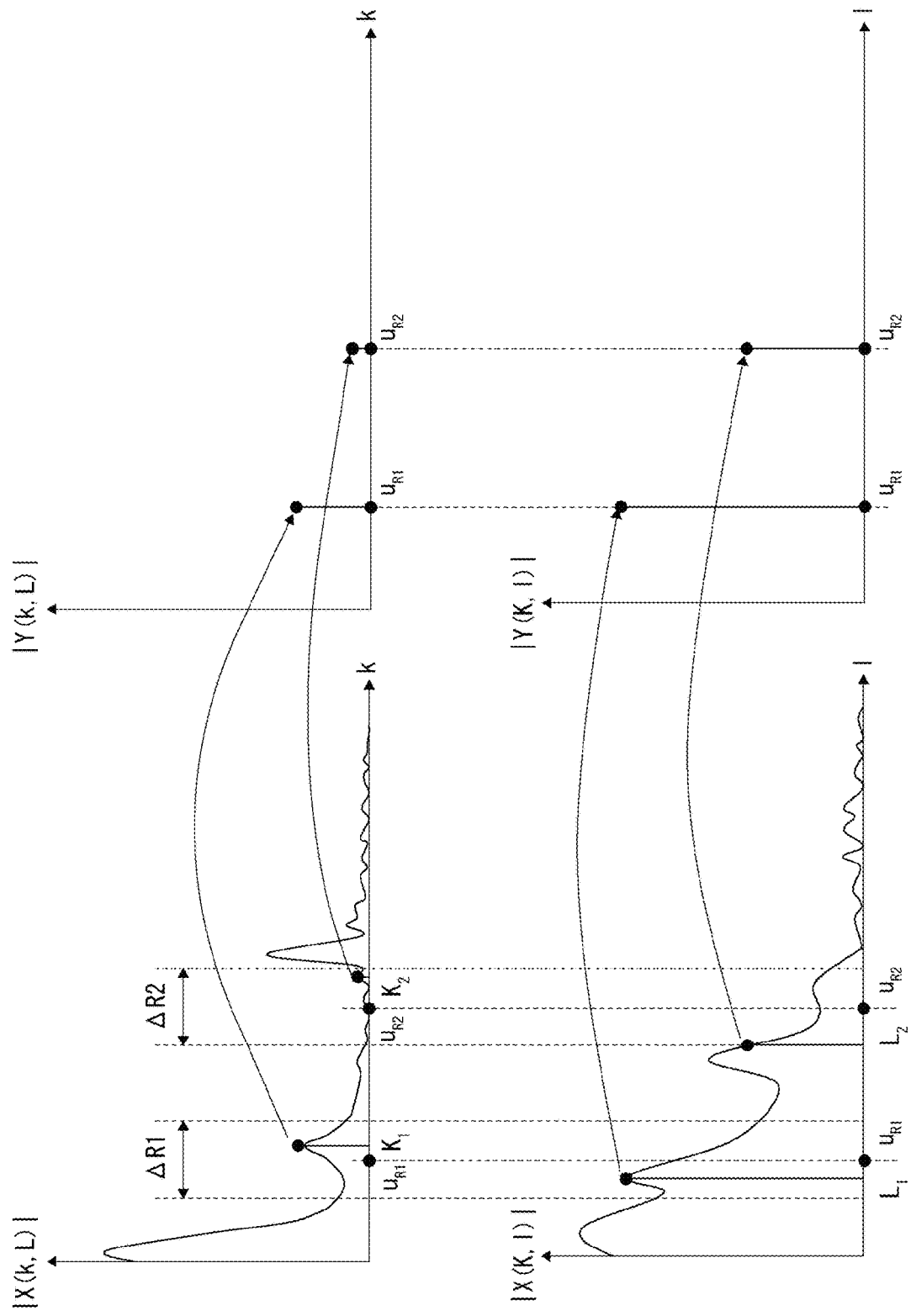
FIG. 14 is a diagram showing an example in which the maximum value is extracted as a representative value in the third example.

FIG. 14 shows an example in which the maximum value is extracted as the representative value described above.

As shown in FIG. 14, although the frequency index of the maximum value of the DCT coefficient X (k, l) in the neighborhood range ΔR1 is the frequency index of a frequency $K_1$ and the frequency index of the maximum value of the DCT coefficient X (k, l) in the neighborhood range ΔR2 is the frequency index of a frequency $K_2$, the frequency indexes assigned to these maximum values are not the frequency indexes of frequencies $K_1$ and $K_2$, but the frequency indexes of the peak frequencies $u_{R1}$ and $u_{R2}$, respectively.

Here, while the way of defining a neighborhood range ΔR of the peak frequency u is arbitrary, as one example, it is conceivable to define the neighborhood range ΔR in the following manner.

For example, as shown in FIG. 15A, a range in which the frequency difference with the peak frequency u is within ω on the low-frequency side and the high-frequency side can be defined as the neighborhood range ΔR. While the frequency difference ω that defines the neighborhood range ΔR1 is shown as "$ω_1$" and the frequency difference ω that defines the neighborhood range ΔR2 is shown as "$ω_2$" in FIG. 15A, these reference signs $ω_1$ and $ω_2$ may be the same value or may be different values. Specific values of $ω_1$ and $ω_2$ can be several Hz to several tens of Hz, for example.

Alternatively, as shown in FIG. 15B, by using the DCT coefficient X (k, l) of the frequency index corresponding to the peak frequency u as a reference value rf, the neighborhood range ΔR can be set to a range until the difference (absolute value) of the DCT coefficient X (k, l) with respect to the reference value rf reaches a predetermined value S. For example, it is conceivable to set the reference value rf to 0 dB, and set the frequency band having a component up to a predetermined attenuation amount (e.g., several dB to several tens of dB) as the neighborhood range ΔR.

In FIG. 15B, the reference value rf and the predetermined value S for defining the neighborhood range ΔR1 are denoted by "$rf_1$" and "$S_1$", respectively, and the reference value rf and the predetermined value S for defining the neighborhood range ΔR2 are denoted by "$rf_2$" and "$S_2$", respectively. Note that the predetermined values $S_1$ and $S_2$ may be the same value or may be different values.

Note that in the case where the neighborhood range ΔR is defined on the basis of the frequency difference ω as shown in FIG. 15A, if the peak frequency of the main component is close to the peak frequency u, the peak frequency of the main component (hereinafter denoted by reference sign "p") can be the center frequency of the neighborhood range ΔR. Specifically, as shown in FIG. 16A, a range in which the frequency difference with the peak frequency p as the center frequency is within ω on the low-frequency side and the high-frequency side is defined as the neighborhood range ΔR.

Additionally, in the case where the neighborhood range ΔR is defined on the basis of the reference value rf and the predetermined value S as shown in FIG. 15B, if the peak frequency p of the main component is close to the peak frequency u, the DCT coefficient X (k, l) corresponding to the peak of the main component can be used as the reference value rf and the neighborhood range ΔR can be determined on the basis of the predetermined value S as shown in FIG. 16B.

In the case of the third example, a coding unit 24 is provided with an extraction unit 42B instead of the extraction unit 42 (see FIG. 10).

For the DCT coefficient X (k, l) obtained by orthogonal transform by an orthogonal transform unit 41, the extraction unit 42B obtains a representative value of the DCT coefficient X (k, l) for each of the neighborhood ranges ΔR1 and ΔR2. Then, these representative values are output to a quantization unit 43 as the DCT coefficient X (k, l) of the frequency index corresponding to the peak frequency $u_{R1}$ and the DCT coefficient X (k, l) of the frequency index corresponding to the peak frequency $u_{R2}$, respectively.

In the third example, it can be said that coded data Cd is coded data in which information amount is compressed on the basis of the characteristic of each receptor. That is, it can be said that a decoding device 3 as the third example that decodes such coded data Cd is a decoding device that decodes coded data in which information amount is compressed on the basis of the characteristic of each receptor.

[4-6. Fourth Example]

In a fourth example, coding is performed to compress information amount on the basis of a device characteristic which is a frequency characteristic of a two-dimensional tactile presentation device 6.

A frequency band in which a main component is obtained does not always match a band in which a device characteristic is good (band with high Q). If there is a band in the vicinity of a main component that includes the peak of a device characteristic, the main component can be virtually shifted or deformed to efficiently present a tactile sensation according to the device characteristic.

A specific example of a coding method as the fourth example will be described with reference to FIG. 17. Note that here, an example of a coding method corresponding to a case of performing tactile reproduction using two two-dimensional tactile presentation devices 6 will be described. Hereinafter, in the fourth example, the two two-dimensional tactile presentation devices 6 are distinguished as "D1" and "D2".

Figure 17:
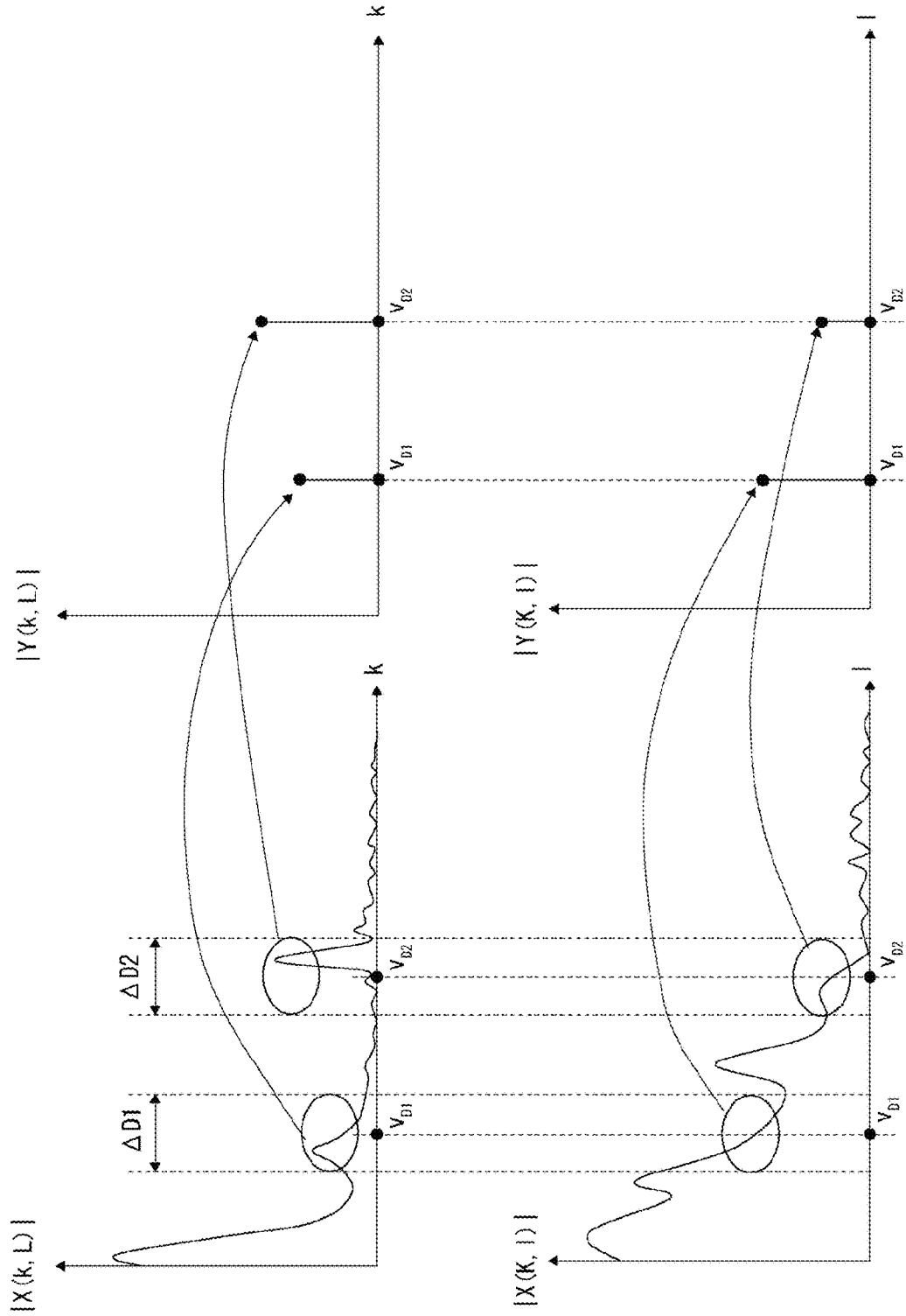
FIG. 17 is an explanatory diagram of a coding method as a fourth example.

Peak frequencies $v_{D1}$ and $v_{D2}$ in FIG. 17 indicate the peak frequencies of the device characteristic of the two-dimensional tactile presentation devices D1 and D2, respectively.

Additionally, neighborhood ranges ΔD1 and ΔD2 in FIG. 17 are frequency ranges defined as the neighborhood ranges of the peak frequencies $v_{D1}$ and $v_{D2}$, respectively.

Here, while the way of setting the range of a neighborhood range ΔD of a peak frequency v is arbitrary, as a specific example, similarly to the neighborhood range ΔR of the peak frequency u described in the third example, for example, the neighborhood range ΔD can be a range determined by using a frequency difference ω and a predetermined value S (see FIGS. 15 and 16).

In the fourth example, the representative value of a DCT coefficient X (k, l) is extracted in the neighborhood ranges ΔD1 and ΔD2 of the peak frequencies $v_{D1}$ and $v_{D2}$, respectively. Here, as the representative value, as in the case of the third example, extracted is a representative value of the DCT coefficient X (k, l) in the target frequency range, such as a weighted average value, a median value, or a maximum value of the DCT coefficient X (k, l) in the frequency range.

At this time, as in the case of the third example, a frequency index corresponding to the peak frequency v is assigned to a frequency index of the extracted DCT coefficient X (k, l). In the example of FIG. 17, assuming that the peak frequencies $v_{D1}$ and $v_{D2}$ each match an index frequency, it is shown that the frequency indexes of the peak frequencies $v_{D1}$ and $v_{D2}$ are assigned as the frequency indexes of the DCT coefficient X (k, l) extracted for the neighborhood ranges ΔD1 and ΔD2, respectively.

In the case of the fourth example, a coding unit 24 is provided with an extraction unit 42C instead of the extraction unit 42 (see FIG. 10).

For the DCT coefficient X (k, l) obtained by orthogonal transform by an orthogonal transform unit 41, the extraction unit 42C obtains a representative value of the DCT coefficient X (k, l) for each of the neighborhood ranges AD1 and AD2. Then, these representative values are output to a quantization unit 43 as the DCT coefficient X (k, l) of the frequency index corresponding to the peak frequency $v_{D1}$ and the DCT coefficient X (k, l) of the frequency index corresponding to the peak frequency $v_{D2}$, respectively.

In the fourth example, it can be said that coded data Cd is coded data in which information amount is compressed by extracting the representative value of an orthogonal transform coefficient in the vicinity of the peak frequency of the device characteristic, which is the frequency characteristic of the tactile presentation device. That is, it can be said that a decoding device 3 as the fourth example that decodes such coded data Cd is a decoding device that decodes coded data in which information amount is compressed by extracting the representative value of an orthogonal transform coefficient in the vicinity of the peak frequency of the device characteristic.

Here, while it is possible to always use the same device as the two-dimensional tactile presentation device 6 connected to the decoding device 3, in order to provide a wider variety of tactile presentation functions, it is also conceivable to replace the two-dimensional tactile presentation device 6 to be connected depending on the use case. In a case of allowing such replacement of the two-dimensional tactile presentation device 6, it is conceivable to switch the settings of the peak frequency v and the neighborhood range ΔD according to the device characteristic of the connected two-dimensional tactile presentation device 6.

Figure 18:
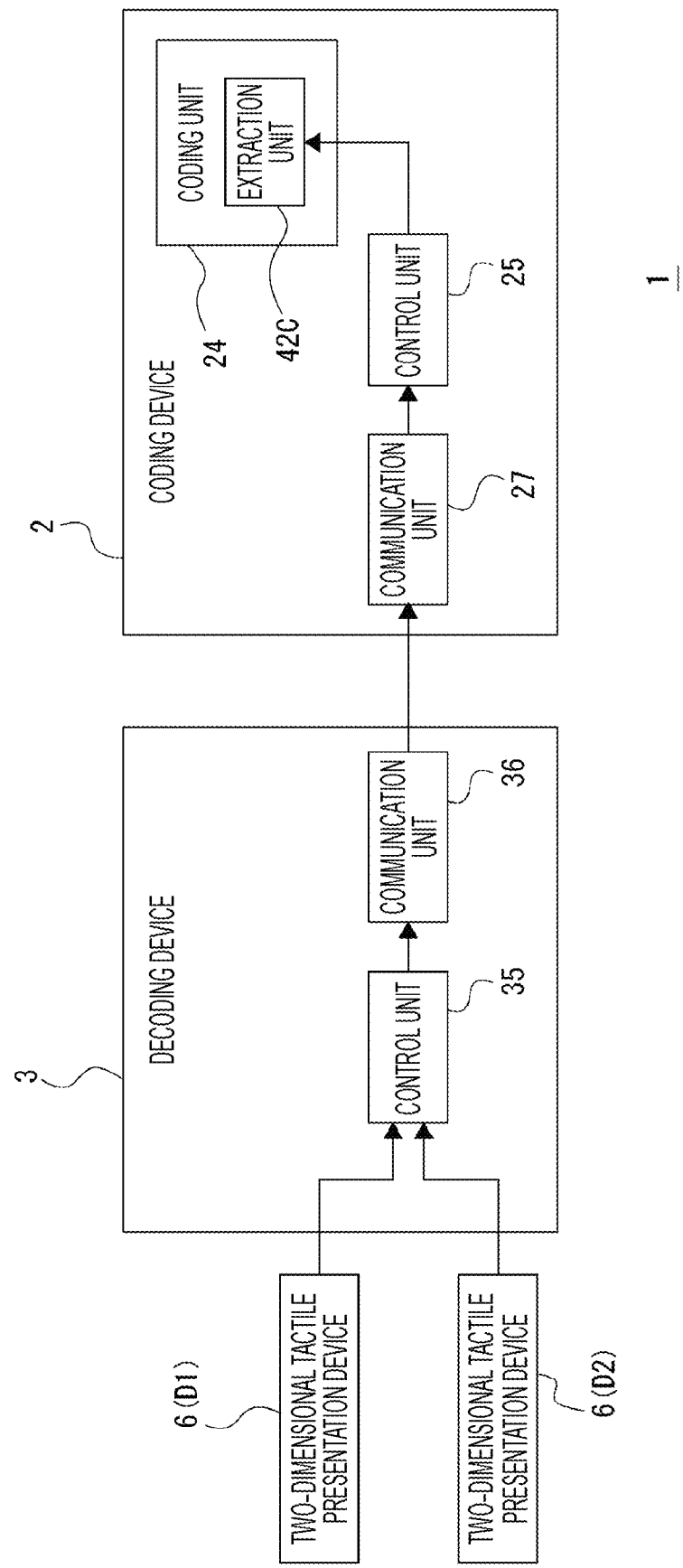
FIG. 18 is a diagram showing a configuration example of a tactile reproduction system for notifying a coding device of device characteristic identification information.

FIG. 18 shows a configuration example of a tactile reproduction system 1 for switching the settings of the peak frequency v and the neighborhood range AD according to the device characteristic of the connected two-dimensional tactile presentation device 6. Note that in FIG. 18, among the components of a coding device 2 and the decoding device 3, only the components related to switching of the settings of the peak frequency v and the neighborhood range ΔD are extracted and shown.

In this case, a control unit 35 in the decoding device 3 acquires device characteristic identification information from each of the two-dimensional tactile presentation devices 6 (D1, D2) connected to the decoding device 3. Device characteristic identification information means information that can identify the device characteristic, such as ID information assigned to each two-dimensional tactile presentation device 6. The control unit 35 causes a communication unit 36 to transmit the acquired device characteristic identification information to the coding device 2.

In the coding device 2, a control unit 25 receives the device characteristic identification information transmitted from the communication unit 36 through a communication unit 27, and outputs the device characteristic identification information to the extraction unit 42C in the coding unit 24. The extraction unit 42C sets the peak frequency v and the neighborhood range AD according to the device characteristic identification information input from the control unit 25, and performs the coding as the fourth example described above.

With such a configuration, for example, the decoding device 3 can notify the coding device 2 of the device characteristic identification information, and the coding device 2 can perform coding by using information on the peak frequency v and the neighborhood range ΔD set according to the device characteristic identification information.

Accordingly, it is possible to implement a tactile reproduction system that can be used by replacing the two-dimensional tactile presentation device 6 with that having a different device characteristic.

Note that the coding and decoding method as the fourth example can be suitably applied not only to a case where tactile reproduction is performed by multiple two-dimensional tactile presentation devices 6, but also to a case where tactile reproduction is performed by a single two-dimensional tactile presentation device 6.

Here, in the case where multiple two-dimensional tactile presentation devices 6 are used for tactile reproduction, in order to improve tactile reproducibility, it is effective to use a two-dimensional tactile presentation device 6 that matches the characteristic of the receptor targeted by the device characteristic. For example, as the two-dimensional tactile presentation devices 6, the two-dimensional tactile presentation device 6 having a device characteristic peak in a relatively low frequency region may be used as the two-dimensional tactile presentation device 6 for Mercel, and the two-dimensional tactile presentation device 6 having a device characteristic peak in a relatively high frequency region may be used as the two-dimensional tactile presentation device 6 for Pachini.

[4-7. Fifth Example]

In a fifth example, coding is performed on the basis of the viewpoint of static tactile sensation and dynamic tactile sensation.

FIG. 19 is an explanatory diagram of a coding method as a fifth example.

In the fifth example, clustering of DCT coefficients X (k, l) is performed on all of the DCT coefficients X (k, l) obtained by orthogonal transform to generate a static tactile sensation and a dynamic tactile sensation. Specifically, the DCT coefficients X (k, l) are divided into a cluster $C_S$, which is a cluster (frequency band) corresponding to static tactile sensation, and a cluster $C_D$, which is a cluster corresponding to dynamic tactile sensation. Here, static tactile sensation is basically obtained by vibration presentation in the low-frequency band, and dynamic tactile sensation is caused by the vibration in the high-frequency band.

In tactile reproduction of the fifth example, two two-dimensional tactile presentation devices 6 are used, one having excellent reproducibility of static tactile sensation and one having excellent reproducibility of dynamic tactile sensation. That is, the two-dimensional tactile presentation device 6 (hereinafter denoted by reference sign "6-1") in which the band with high Q is the low-frequency band and the two-dimensional tactile presentation device 6 (hereinafter denoted by reference sign "6-2") in which the band with high Q is a high-frequency band are used.

In FIG. 19, a peak frequency $P_S$ represents the peak frequency of the device characteristic of the two-dimensional tactile presentation device 6-1 and a peak frequency $P_D$ represents the peak frequency of the device characteristic of the two-dimensional tactile presentation device 6-2.

The clusters $C_S$ and $C_D$ are to include not only the DCT coefficients X (k, l) in the vicinity of the peak frequencies $P_S$ and $P_D$, respectively, but the DCT coefficients X (k, l) in the entire band covered by the two-dimensional tactile presentation device 6-1 and the DCT coefficients X (k, l) in the entire band covered by the two-dimensional tactile presentation device 6-2, respectively. The cluster $C_S$ is set to include the peak frequency $P_S$, and the cluster $C_D$ is set to include the peak frequency $P_D$.

Then, in a coding method as the fifth example, the representative value of the DCT coefficient X (k, l) in the frequency band as the cluster $C_S$ and the representative value of the DCT coefficient X (k, l) in the frequency band as the cluster $C_D$ are extracted, and coded data Cd is generated using only these representative values as targets for quantization. Note that the definition of the representative value is similar to that in the third and fourth examples. At this time, frequency indexes assigned to the representative value of the cluster $C_S$ and the representative value of the cluster $C_S$ are frequency indexes corresponding to the peak frequency $P_S$ and the peak frequency $P_D$, respectively.

In the case of the fifth example, a coding unit 24 is provided with an extraction unit 42D instead of the extraction unit 42 (see FIG. 10).

For the DCT coefficient X (k, l) obtained by orthogonal transform by an orthogonal transform unit 41, the extraction unit 42D obtains a representative value of the DCT coefficient X (k, l) in each of the frequency band as the cluster $C_S$ and the frequency band as the cluster $C_D$. Then, these representative values are output to a quantization unit 43 as the DCT coefficient X (k, l) of the frequency index corresponding to the peak frequency $P_S$ and the DCT coefficient X (k, l) of the frequency index corresponding to the peak frequency $P_D$, respectively.

Figure 20:
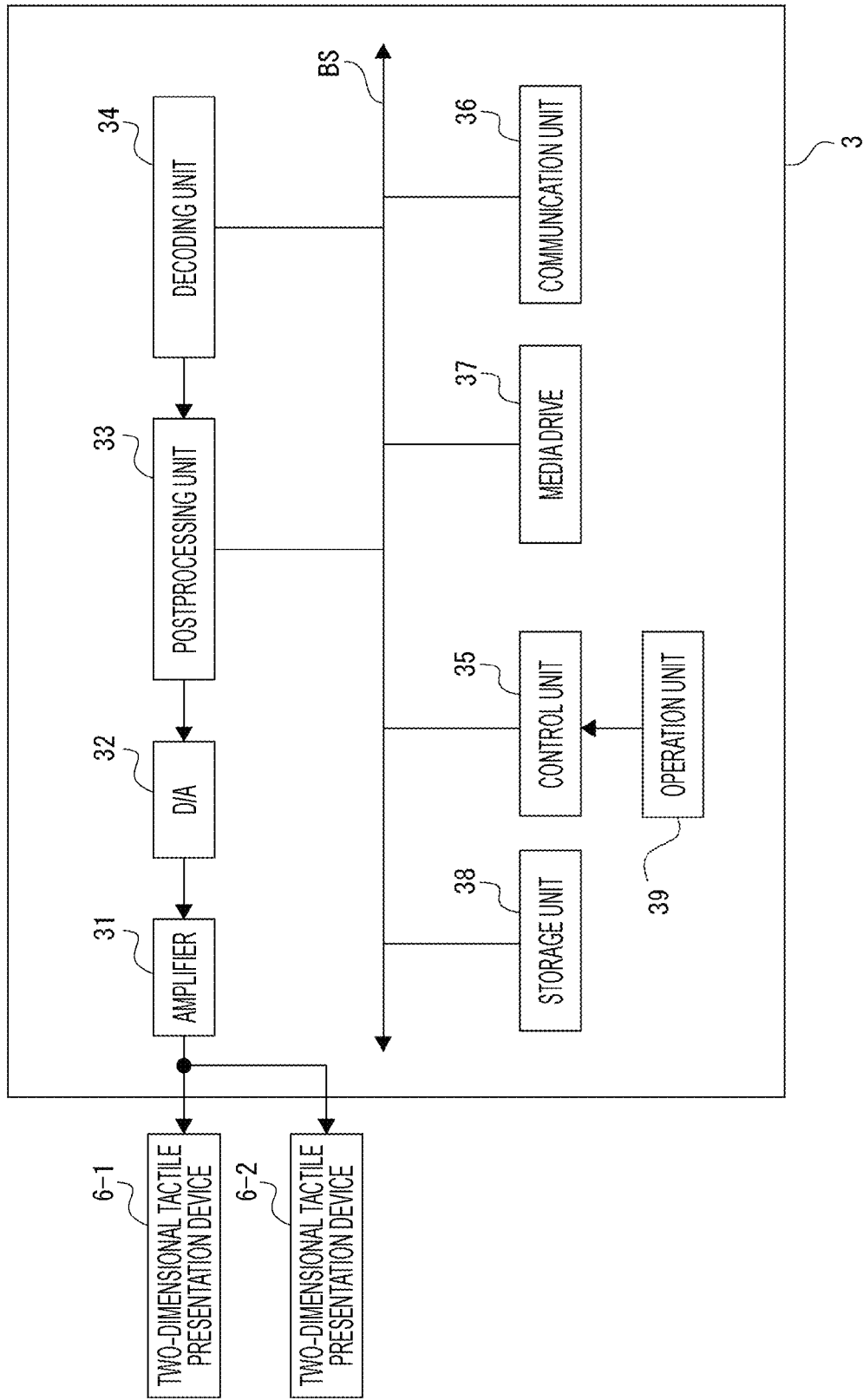
FIG. 20 is a diagram for describing an example of the internal configuration of a decoding device of the fifth example.

FIG. 20 is a diagram for describing an example of the internal configuration of a decoding device 3 of the fifth example.

The decoding device 3 of the fifth example drives the two-dimensional tactile presentation devices 6-1 and 6-2 on the basis of a two-dimensional tactile signal obtained by decoding, in a decoding unit 34, coded data Cd obtained by the coding described above. Specifically, FIG. 20 illustrates a configuration in which a two-dimensional tactile signal obtained by decoding the coded data Cd by the decoding unit 34, that is, a two-dimensional tactile signal including both a representative value component of the cluster $C_S$ and a representative value component of the cluster CD is input to drive both the two-dimensional tactile presentation devices 6-1 and 6-2.

Note that it is also possible to individually perform, for example, inverse orthogonal transform on each of the representative value of the cluster $C_S$ and the representative value of the cluster $C_D$ to individually generate a two-dimensional tactile signal containing only the representative value component of the cluster $C_S$ and a two-dimensional tactile signal containing only the representative value component of the cluster $C_D$, and drive the two-dimensional tactile presentation devices 6-1 and 6-2 individually by the two-dimensional tactile signals.

Note that while an example of using multiple two-dimensional tactile presentation devices 6 has been given above, in a case where a two-dimensional tactile presentation device 6 having multiple resonance points is used, it is not necessary to use multiple two-dimensional tactile presentation devices 6.

In the fifth example, it can be said that the coded data Cd is coded data in which information amount is compressed by extracting the representative value of an orthogonal transform coefficient from the frequency band corresponding to the static tactile sensation and the frequency band corresponding to the dynamic tactile sensation. That is, it can be said that the decoding device 3 as the fifth example that decodes such coded data Cd is a decoding device that decodes coded data in which information amount is compressed by extracting the representative value of an orthogonal transform coefficient from the frequency band corresponding to the static tactile sensation and the frequency band corresponding to the dynamic tactile sensation.

Here, in the fifth example, since the component of the cluster $C_S$ corresponding to the static tactile sensation is a low-frequency component, it is considered that tactile reproducibility is unlikely to decrease even if the particle size in the time direction is decreased.

Hence, as illustrated in FIG. 21, for example, it is conceivable to reduce the bit rate by including the component of the cluster $C_S$ corresponding to the static tactile sensation in the coded data Cd less frequently than the component of the cluster CD corresponding to the dynamic tactile sensation.

FIG. 21A shows an example in which the sampling rate of the cluster $C_S$ component is ¼ of that of the cluster $C_D$ component, and FIG. 21B shows an example in which the sampling rate of the cluster $C_S$ component is ¹⁄₁₀ of that of the cluster $C_D$ component.

Note that as for the classification of static tactile sensation and dynamic tactile sensation, the static tactile sensation may be a component with frequency=0 (or component in the vicinity of 0), that is, a DC component, and the dynamic tactile sensation may the other frequency components. The DC component referred to here can be paraphrased as a component for perceiving the "uneven shape" itself of a tactile presentation surface. That is, by classifying the static tactile sensation and the dynamic tactile sensation as described above, it is possible to perform multiple presentations of an object shape and its fine texture (e.g., presentation of sensation such as when stroking an animal with hair).

At this time, since the cluster $C_S$ component is a DC component, tactile reproducibility is unlikely to decrease even if the sampling rate is lowered, and therefore the bit rate of the coded data Cd can be further reduced.

<5. Summary of Embodiment and Modification>

As described above, the coding device (coding device 2) as the embodiment includes the coding unit (coding unit 24)

that performs coding of compressing information amount by orthogonally transforming a two-dimensional tactile signal based on a time signal.

By orthogonally transforming a two-dimensional tactile signal based on a time signal, it is possible to compress information amount by removing frequency components that are difficult for humans to perceive, as in the case of an image signal, for example.

Accordingly, it is possible to reduce data amount while ensuring tactile reproducibility of a two-dimensional tactile signal, and improve the efficiency of a system related to tactile reproduction.

Additionally, in the coding device as the embodiment, the coding unit (see extraction unit 42) compresses information amount by extracting the low-frequency component.

With orthogonal conversion such as DCT, the energy of a time signal is efficiently concentrated on the low-frequency side of a spectrum. Hence, even if the low-frequency component is extracted and the other components are removed, it is unlikely that the recipient will sense unnaturalness.

Accordingly, it is possible to reduce data amount while ensuring tactile reproducibility of a two-dimensional tactile signal, and improve the efficiency of a system related to tactile reproduction.

Moreover, in the coding device as the embodiment, the coding unit compresses information amount on the basis of the human tactile characteristic.

This makes it possible to compress information amount by removing frequency components having low human tactile sensitivity.

Accordingly, it is possible to reduce data amount while ensuring tactile reproducibility of a two-dimensional tactile signal, and improve the efficiency of a system related to tactile reproduction.

Furthermore, in the coding device as the embodiment, the coding unit (see extraction unit 42A) compresses information amount by extracting the frequency component whose absolute value of the orthogonal transform coefficient is equal to or greater than a threshold.

This makes it possible to extract frequency components that are presumed to be easily perceived by humans in terms of the magnitude of the orthogonal transform coefficient (spectrum) and remove other components.

Accordingly, it is possible to reduce data amount while ensuring tactile reproducibility of a two-dimensional tactile signal, and improve the efficiency of a system related to tactile reproduction.

Additionally, in the coding device as the embodiment, the threshold is a threshold determined on the basis of the human tactile characteristic.

As a result, it is possible to remove frequency components having low human tactile sensitivity even if the orthogonal transform coefficient is large.

Accordingly, it is possible to further reduce data amount while ensuring tactile reproducibility.

Moreover, in the coding device as the embodiment, the coding unit (see extraction unit 42B) compresses information amount on the basis of the tactile characteristic of each receptor.

This makes it possible to extract highly sensitive frequency components for each receptor and remove other components.

Accordingly, it is possible to reduce data amount while ensuring tactile reproducibility, and improve the efficiency of a system related to tactile reproduction.

Furthermore, in the coding device as the embodiment, the coding unit compresses information amount by extracting the representative value of an orthogonal transform coefficient in the vicinity of the peak frequency of the sensitivity of a receptor.

The above representative value means a typical value of the orthogonal transform coefficient in the vicinity of the peak frequency, such as a weighted average value, a median value, and a maximum value of the orthogonal transform coefficient in the vicinity of the peak frequency. By extracting such a representative value, it is possible to appropriately extract a frequency component having high sensitivity of the receptor.

Accordingly, it is possible to reduce data amount while ensuring tactile reproducibility, and improve the efficiency of a system related to tactile reproduction.

Additionally, in the coding device as the embodiment, the coding unit assigns a frequency index corresponding to the peak frequency of the sensitivity of the receptor as a frequency index of the representative value.

This makes it possible to efficiently present tactile sensation according to the peak frequency of the sensitivity of the receptor.

Accordingly, it is possible to reduce data amount ensuring tactile reproducibility.

Moreover, in the coding device as the embodiment, the coding unit compresses information amount on the basis of the device characteristic, which is the frequency characteristic of the tactile presentation device.

As a result, it is possible for the tactile presentation device to extract frequency components capable of efficiently presenting tactile sensation, and to remove other components.

Accordingly, it is possible to reduce data amount while ensuring tactile reproducibility, and improve the efficiency of a system related to tactile reproduction.

Furthermore, in the coding device as the embodiment, the coding unit compresses information amount on the basis of the device characteristics of multiple tactile presentation devices.

As a result, in a case of presenting tactile sensation using a different tactile presentation device for each receptor, or using a different tactile presentation device for each of a static tactile sensation and a dynamic tactile sensation, it is possible for each tactile presentation device to extract frequency components that can present tactile sensation efficiently and remove other components.

Accordingly, in a case where tactile sensation is presented using multiple tactile presentation devices, it is possible to reduce data amount while ensuring tactile reproducibility.

Additionally, in the coding device as the embodiment, the coding unit (see extraction unit 42C) compresses information amount by extracting the representative value of an orthogonal transform coefficient in the vicinity of the peak frequency of a device characteristic.

This makes it possible for the tactile presentation device to appropriately extract frequency components capable of efficiently presenting tactile sensation.

Accordingly, it is possible to reduce data amount while ensuring tactile reproducibility, and improve the efficiency of a system related to tactile reproduction.

Moreover, in the coding device as the embodiment, the coding unit assigns a frequency index corresponding to the peak frequency of the device characteristic as a frequency index of the representative value.

This makes it possible to efficiently present tactile sensation according to the peak frequency of the device characteristics.

Accordingly, it is possible to reduce data amount ensuring tactile reproducibility.

Furthermore, in the coding device as the embodiment, the coding unit (see extraction unit 42D) compresses information amount by extracting the representative value of an orthogonal transform coefficient from the frequency band corresponding to the static tactile sensation and the frequency band corresponding to the dynamic tactile sensation.

As a result, in a case of reproducing both the static tactile sensation and the dynamic tactile sensation, it is possible to appropriately compress information amount.

That is, it is possible to reduce data amount while ensuring tactile reproducibility.

Additionally, in the coding device as the embodiment, the coding unit sets the frequency of including the representative value extracted from the frequency band corresponding to the static tactile sensation in coded data lower than the frequency of including the representative value extracted from the frequency band corresponding to the dynamic tactile sensation in the coded data.

Since the static tactile sensation is given by a low-frequency tactile stimulus, the reproducibility of tactile sensation is unlikely to decrease even if the static tactile sensation is included less frequently in the coded data.

Accordingly, it is possible to further reduce data amount while suppressing decrease in tactile reproducibility.

Additionally, the coding method as the embodiment is a coding method of performing coding of compressing information amount by orthogonally transforming a two-dimensional tactile signal based on a time signal.

With such a coding method, too, an operation and effect similar to those of the coding device as the embodiment described above can be obtained.

Additionally, the decoding device (decoding device 3) as the embodiment includes the decoding unit (decoding unit 34) that decodes coded data obtained by performing coding of compressing information amount by orthogonally transforming a two-dimensional tactile signal based on a time signal.

By orthogonally transforming a two-dimensional tactile signal based on a time signal, it is possible to compress information amount by removing frequency components that are difficult for humans to perceive, as in the case of an image signal, for example.

Accordingly, it is possible to reduce data amount while ensuring tactile reproducibility of a two-dimensional tactile signal, and improve the efficiency of a system related to tactile reproduction.

Additionally, in the decoding device as the embodiment, the decoding unit decodes coded data in which information amount is compressed by extracting the low-frequency component.

With orthogonal conversion such as DCT, the energy of a time signal is efficiently concentrated on the low-frequency side of a spectrum. Hence, even if the low-frequency component is extracted and the other components are removed, it is unlikely that the recipient will sense unnaturalness.

Accordingly, it is possible to reduce data amount while ensuring tactile reproducibility of a two-dimensional tactile signal, and improve the efficiency of a system related to tactile reproduction.

Moreover, in the decoding device as the embodiment, the decoding unit decodes coded data in which information amount is compressed on the basis of the human tactile characteristic.

This makes it possible to compress information amount by removing frequency components having low human tactile sensitivity.

Accordingly, it is possible to reduce data amount while ensuring tactile reproducibility of a two-dimensional tactile signal, and improve the efficiency of a system related to tactile reproduction.

Furthermore, in the decoding device as the embodiment, the decoding unit decodes coded data in which information amount is compressed by extracting the frequency component whose absolute value of the orthogonal transform coefficient is equal to or greater than a threshold.

This makes it possible to extract frequency components that are presumed to be easily perceived by humans in terms of the magnitude of the orthogonal transform coefficient (spectrum) and remove other components.

Accordingly, it is possible to reduce data amount while ensuring tactile reproducibility of a two-dimensional tactile signal, and improve the efficiency of a system related to tactile reproduction.

Additionally, in the decoding device as the embodiment, the threshold is a threshold determined on the basis of the human tactile characteristic.

As a result, it is possible to remove frequency components having low human tactile sensitivity even if the orthogonal transform coefficient is large.

Accordingly, it is possible to further reduce data amount while ensuring tactile reproducibility.

Additionally, in the decoding device as the embodiment, the decoding unit decodes coded data in which information amount is compressed on the basis of the tactile characteristic of each receptor.

This makes it possible to extract highly sensitive frequency components for each receptor and remove other components.

Accordingly, it is possible to reduce data amount while ensuring tactile reproducibility, and improve the efficiency of a system related to tactile reproduction.

Moreover, in the decoding device as the embodiment, the decoding unit decodes coded data in which information amount is compressed by extracting the representative value of an orthogonal transform coefficient in the vicinity of the peak frequency of the sensitivity of a receptor.

The above representative value means a typical value of the orthogonal transform coefficient in the vicinity of the peak frequency, such as a weighted average value, a median value, and a maximum value of the orthogonal transform coefficient in the vicinity of the peak frequency. By extracting such a representative value, it is possible to appropriately extract a frequency component having high sensitivity of the receptor.

Accordingly, it is possible to reduce data amount while ensuring tactile reproducibility, and improve the efficiency of a system related to tactile reproduction.

Furthermore, in the decoding device as the embodiment, the decoding unit decodes coded data in which a frequency index corresponding to the peak frequency of the sensitivity of the receptor is assigned as a frequency index of the representative value.

This makes it possible to efficiently present tactile sensation according to the peak frequency of the sensitivity of the receptor.

Accordingly, it is possible to reduce data amount ensuring tactile reproducibility.

Additionally, in the decoding device as the embodiment, the decoding unit decodes coded data in which information amount is compressed on the basis of the device characteristic, which is the frequency characteristic of the tactile presentation device.

As a result, it is possible for the tactile presentation device to extract frequency components capable of efficiently presenting tactile sensation, and to remove other components.

Accordingly, it is possible to reduce data amount while ensuring tactile reproducibility, and improve the efficiency of a system related to tactile reproduction.

Moreover, in the decoding device as the embodiment, the decoding unit decodes coded data in which information amount is compressed on the basis of the device characteristics of multiple tactile presentation devices.

As a result, in a case of presenting tactile sensation using a different tactile presentation device for each receptor, or using a different tactile presentation device for each of a static tactile sensation and a dynamic tactile sensation, it is possible for each tactile presentation device to extract frequency components that can present tactile sensation efficiently and remove other components.

Accordingly, in a case where tactile sensation is presented using multiple tactile presentation devices, it is possible to reduce data amount while ensuring tactile reproducibility.

Furthermore, in the decoding device as the embodiment, the decoding unit decodes coded data in which information amount is compressed by extracting the representative value of the orthogonal transform coefficient in the vicinity of the peak frequency of the device characteristic.

This makes it possible for the tactile presentation device to appropriately extract frequency components capable of efficiently presenting tactile sensation.

Accordingly, it is possible to reduce data amount while ensuring tactile reproducibility, and improve the efficiency of a system related to tactile reproduction.

Additionally, in the decoding device as the embodiment, the decoding unit decodes coded data in which a frequency index corresponding to the peak frequency of the device characteristic is assigned as a frequency index of the representative value.

This makes it possible to efficiently present tactile sensation according to the peak frequency of the device characteristics.

Accordingly, it is possible to reduce data amount ensuring tactile reproducibility.

Moreover, the decoding device as the embodiment includes an information transmission unit (control unit 35 and communication unit 36) that transmits information for identifying a device characteristic to an external device.

As a result, it is possible to notify the coding device of information for identifying the device characteristics of the tactile presentation device.

Accordingly, it is possible to provide a tactile reproduction system that can be used by replacing a tactile presentation device with that having a different device characteristic.

Furthermore, in the decoding device as the embodiment, the decoding unit decodes coded data in which information amount is compressed by extracting the representative value of an orthogonal transform coefficient from the frequency band corresponding to the static tactile sensation and the frequency band corresponding to the dynamic tactile sensation.

As a result, in a case of reproducing both the static tactile sensation and the dynamic tactile sensation, it is possible to appropriately compress information amount.

That is, it is possible to reduce data amount while ensuring tactile reproducibility.

Additionally, in the decoding device as the embodiment, the decoding unit decodes coded data in which the frequency of including the representative value extracted from the frequency band corresponding to the static tactile sensation is lower than the frequency of including the representative value extracted from the frequency band corresponding to the dynamic tactile sensation.

Since the static tactile sensation is given by a low-frequency tactile stimulus, the reproducibility of tactile sensation is unlikely to decrease even if the static tactile sensation is included less frequently in the coded data.

Accordingly, it is possible to further reduce data amount while suppressing decrease in tactile reproducibility.

Additionally, the decoding method as the embodiment is a decoding method for decoding coded data obtained by performing coding of compressing information amount by orthogonally transforming a two-dimensional tactile signal based on a time signal.

With such a decoding method as the embodiment, too, an operation and effect similar to those of the decoding device as the embodiment described above can be obtained.

Here, the functions of the coding unit (24) and the decoding unit (34) described so far can be implemented as software processing by a CPU or the like. The software processing is executed on the basis of a program, and the program is stored in a storage device readable by a computer device (information processing apparatus) such as a CPU.

The coding-side program as the embodiment is a program that causes an information processing apparatus to achieve a function of performing coding of compressing information amount by orthogonally transforming a two-dimensional tactile signal based on a time signal.

Additionally, the decoding-side program as the embodiment is a program that causes an information processing apparatus to achieve a function of decoding coded data obtained by performing coding of compressing information amount by orthogonally transforming a two-dimensional tactile signal based on a time signal.

With these programs, it is possible to implement the coding device and the decoding device as the embodiments described above.

The present technology is not limited to the above-mentioned specific examples.

For example, in the above, an example of coding a tactile signal detected by a tactile sensor has been given. However, in the present technology, the tactile signal to be coded may be a signal artificially generated by using, for example, a computer device or the like, and is not limited to the tactile signal detected by the tactile sensor.

Additionally, the third example gives an example in which a frequency index corresponding to the frequency peak of a receptor is assigned to a frequency index of the representative value of an orthogonal transform coefficient extracted on the basis of a characteristic of the receptor. At this time, the frequency index assigned to the representative value extracted on the basis of the characteristic of the receptor can also be a frequency index corresponding to the peak frequency of the device characteristic.

Note that as can be understood from this point as well, the coding of the embodiment can be coding of compressing information amount on the basis of both the tactile characteristic and the device characteristic, for example.

The effect described in the present specification is merely an illustration and is not restrictive. Hence, other effects can be obtained.

<6. Present Technology>
Note that the present technology can also be configured in the following manner.

(1)
A decoding device including
a decoding unit that decodes coded data obtained by performing coding of compressing information amount by orthogonally transforming a two-dimensional tactile signal based on a time signal.

(2)
The decoding device according to (1) above, in which
the decoding unit
decodes the coded data in which information amount is compressed by extracting a low-frequency component.

(3)
The decoding device according to (1) above, in which
the decoding unit
decodes the coded data in which information amount is compressed on the basis of a human tactile characteristic.

(4)
The decoding device according to (1) or (3) above, in which
the decoding unit
decodes the coded data in which information amount is compressed by extracting a frequency component whose absolute value of an orthogonal transform coefficient is equal to or greater than a threshold.

(5)
The decoding device according to (4) above, in which
the threshold is a threshold determined on the basis of a human tactile characteristic.

(6)
The decoding device according to (3) above, in which
the decoding unit
decodes the coded data in which information amount is compressed on the basis of a tactile characteristic of each receptor.

(7)
The decoding device according to (6) above, in which
the decoding unit
decodes the coded data in which information amount is compressed by extracting a representative value of an orthogonal transform coefficient in the vicinity of a peak frequency of a sensitivity of the receptor.

(8)
The decoding device according to (7) above, in which
the decoding unit
decodes the coded data in which a frequency index corresponding to the peak frequency of the sensitivity of the receptor is assigned as a frequency index of the representative value.

(9)
The decoding device according to (1), (2), or (4) above, in which
the decoding unit
decodes the coded data in which information amount is compressed on the basis of a device characteristic, which is a frequency characteristic of a tactile presentation device.

(10)
The decoding device according to (9) above, in which
the decoding unit
decodes the coded data in which information amount is compressed on the basis of the device characteristic of multiple tactile presentation devices.

(11)
The decoding device according to (9) or (10) above, in which
the decoding unit
decodes the coded data in which information amount is compressed by extracting a representative value of an orthogonal transform coefficient in the vicinity of a peak frequency of the device characteristic.

(12)
The decoding device according to (11) above, in which
the decoding unit
decodes the coded data in which a frequency index corresponding to the peak frequency of the device characteristic is assigned as a frequency index of the representative value.

(13)
The decoding device according to any one of (9) to (12) above further including
an information transmission unit that transmits information for identifying the device characteristic to an external device.

(14)
The decoding device according to (1), (12), or (13) above, in which
the decoding unit
decodes the coded data in which information amount is compressed by extracting a representative value of an orthogonal transform coefficient from a frequency band corresponding to a static tactile sensation and a frequency band corresponding to a dynamic tactile sensation.

(15)
The decoding device according to (14) above, in which
the decoding unit
decodes the coded data in which a frequency of including the representative value extracted from the frequency band corresponding to the static tactile sensation is set lower than a frequency of including the representative value extracted from the frequency band corresponding to the dynamic tactile sensation.

REFERENCE SIGNS LIST

1 Tactile reproduction system
2 Coding device
3 Decoding device
5 Two-dimensional tactile sensor
6, 6-1, 6-2 Two-dimensional tactile presentation device
24, 24A, 24C, 24D Coding unit
34 Decoding unit
35 Control unit
36 Communication unit
41 Orthogonal transform unit
42, 42A, 42B, 42C, 42D extraction unit
43 Quantization unit
44 Coding processing unit
45 Multiplexing unit
51 Demultiplexing unit
52 Decoding processing unit
53 Inverse quantization unit
54 Inverse orthogonal transform unit
Cd Coded data

The invention claimed is:
1. A coding device comprising
a coding unit that performs coding of compressing information amount by orthogonally transforming a two-dimensional tactile signal based on a time signal;

wherein the coding unit decodes coded data in which the information amount is compressed by extracting a frequency component whose absolute value of an orthogonal transform coefficient is equal to or greater than a threshold.

2. The decoding device according to claim 1, wherein the threshold is a threshold determined on a basis of a human tactile characteristic.

3. A coding method comprising
performing coding of compressing information amount by orthogonally transforming a two-dimensional tactile signal based on a time signal;
wherein the coding decodes coded data in which the information amount is compressed by extracting a frequency component whose absolute value of an orthogonal transform coefficient is equal to or greater than a threshold.

4. A program that causes an information processing apparatus to achieve a function of performing coding of compressing information amount by orthogonally transforming a two-dimensional tactile signal based on a time signal;
wherein the coding decodes coded data in which the information amount is compressed by extracting a frequency component whose absolute value of an orthogonal transform coefficient is equal to or greater than a threshold.

5. A decoding device comprising
a decoding unit that decodes coded data obtained by performing coding of compressing information amount by orthogonally transforming a two-dimensional tactile signal based on a time signal;
wherein the decoding unit decodes the coded data in which the information amount is compressed by extracting a frequency component whose absolute value of an orthogonal transform coefficient is equal to or greater than a threshold.

6. The decoding device according to claim 5, wherein the decoding unit
decodes the coded data in which information amount is compressed by extracting a low-frequency component.

7. The decoding device according to claim 5, wherein the decoding unit
decodes the coded data in which information amount is compressed on a basis of a human tactile characteristic.

8. The decoding device according to claim 7, wherein the decoding unit
decodes the coded data in which information amount is compressed on a basis of a tactile characteristic of each receptor.

9. The decoding device according to claim 8, wherein the decoding unit
decodes the coded data in which information amount is compressed by extracting a representative value of an orthogonal transform coefficient in the vicinity of a peak frequency of a sensitivity of the receptor.

10. The decoding device according to claim 9, wherein the decoding unit
decodes the coded data in which a frequency index corresponding to the peak frequency of the sensitivity of the receptor is assigned as a frequency index of the representative value.

11. The decoding device according to claim 5, wherein the decoding unit
decodes the coded data in which information amount is compressed on a basis of a device characteristic, which is a frequency characteristic of a tactile presentation device.

12. The decoding device according to claim 11, wherein the decoding unit
decodes the coded data in which information amount is compressed on a basis of the device characteristic of a plurality of tactile presentation devices.

13. The decoding device according to claim 11, wherein the decoding unit
decodes the coded data in which information amount is compressed by extracting a representative value of an orthogonal transform coefficient in the vicinity of a peak frequency of the device characteristic.

14. The decoding device according to claim 13, wherein the decoding unit
decodes the coded data in which a frequency index corresponding to the peak frequency of the device characteristic is assigned as a frequency index of the representative value.

15. The decoding device according to claim 11 further comprising an information transmission unit that transmits information for identifying the device characteristic to an external device.

16. The decoding device according to claim 5, wherein the decoding unit
decodes the coded data in which information amount is compressed by extracting a representative value of an orthogonal transform coefficient from a frequency band corresponding to a static tactile sensation and a frequency band corresponding to a dynamic tactile sensation.

17. The decoding device according to claim 16, wherein the decoding unit
decodes the coded data in which a frequency of including the representative value extracted from the frequency band corresponding to the static tactile sensation is set lower than a frequency of including the representative value extracted from the frequency band corresponding to the dynamic tactile sensation.

18. A decoding method comprising
decoding coded data obtained by performing coding of compressing information amount by orthogonally transforming a two-dimensional tactile signal based on a time signal;
wherein the decoding decodes coded data in which the information amount is compressed by extracting a frequency component whose absolute value of an orthogonal transform coefficient is equal to or greater than a threshold.

19. A program that causes an information processing apparatus to achieve a function of decoding coded data obtained by performing coding of compressing information amount by orthogonally transforming a two-dimensional tactile signal based on a time signal;
wherein the coding decodes the coded data in which the information amount is compressed by extracting a frequency component whose absolute value of an orthogonal transform coefficient is equal to or greater than a threshold.

* * * * *